(12) United States Patent
Suzuki et al.

(10) Patent No.: US 10,030,113 B2
(45) Date of Patent: Jul. 24, 2018

(54) GAS BARRIER FILM AND METHOD FOR PRODUCING IT

(71) Applicant: DAI NIPPON PRINTING CO., LTD., Tokyo (JP)

(72) Inventors: Azusa Suzuki, Tokyo (JP); Hiroyuki Iwahashi, Tokyo (JP); Takeshi Nishizono, Tokyo (JP); Shigeki Matsui, Tokyo (JP); Kazutoshi Haraguchi, Chiba (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 129 days.

(21) Appl. No.: 15/301,213

(22) PCT Filed: Mar. 27, 2015

(86) PCT No.: PCT/JP2015/059705
§ 371 (c)(1),
(2) Date: Sep. 30, 2016

(87) PCT Pub. No.: WO2015/152069
PCT Pub. Date: Oct. 8, 2015

(65) Prior Publication Data
US 2017/0009034 A1    Jan. 12, 2017

(30) Foreign Application Priority Data

Mar. 31, 2014  (JP) ................................. 2014-073309
Mar. 31, 2014  (JP) ................................. 2014-073310

(51) Int. Cl.
*B32B 27/00*    (2006.01)
*C08J 7/04*     (2006.01)
(Continued)

(52) U.S. Cl.
CPC .............. *C08J 7/045* (2013.01); *B32B 27/00* (2013.01); *B65D 65/42* (2013.01); *C08J 7/047* (2013.01);
(Continued)

(58) Field of Classification Search
None
See application file for complete search history.

(56) References Cited

U.S. PATENT DOCUMENTS 9,219,018 B2 * 12/2015 Uebayashi ............ H01L 23/296

FOREIGN PATENT DOCUMENTS

CN          101405335       4/2009
JP           2790054 B      8/1988
(Continued)

OTHER PUBLICATIONS

Bang et al. "Biodegradable poly(lactic acid)—based hybrid coating materials for food packaging films with gas barrier properties" Journal of Industrial and Engineering Chemistry, 2012, 18, 1063-1068. (Year: 2012).*

(Continued)

*Primary Examiner* — Robert S Loewe
(74) *Attorney, Agent, or Firm* — Hamre, Schumann, Mueller & Larson, P.C.

(57) ABSTRACT

The invention provides a gas barrier film with low deterioration in the gas barrier property before and after high-temperature hot water treatment. The gas barrier film has a gas barrier coating film, formed as a composite film comprising a network structure having a mesh structure with Si—O—Si bonds as the basic lattice and a water-soluble polymer crystallized as microcrystals, incorporated into the mesh of the network structure, wherein a barrier coating agent, obtained by mixing a condensate solution of an alkoxysilane hydrolysate prepared as a mixed solution in (Continued)

Silica mesh structure which the proportion of bonded states of the silicon atoms of the condensate with Q1 and Q2 structures is at least 60% of the total silicon atoms, with a crystalline water-soluble polymer, is coated on a base material film, either after forming or without forming an aluminum oxide vapor deposition film, to form a coating layer.

22 Claims, 1 Drawing Sheet

(51) Int. Cl.
| | |
|---|---|
| *B65D 65/42* | (2006.01) |
| *C23C 16/02* | (2006.01) |
| *C23C 16/40* | (2006.01) |
| *C23C 16/44* | (2006.01) |
| *H01J 37/32* | (2006.01) |
| *C23C 18/12* | (2006.01) |
| *B05D 3/14* | (2006.01) |
| *B05D 7/04* | (2006.01) |
| *B05D 3/02* | (2006.01) |

(52) U.S. Cl.
CPC ............ *C23C 16/02* (2013.01); *C23C 16/403* (2013.01); *C23C 16/44* (2013.01); *C23C 18/1254* (2013.01); *H01J 37/3244* (2013.01); *H01J 37/3277* (2013.01); *H01J 37/32568* (2013.01); *H01J 37/32899* (2013.01); *B05D 3/0254* (2013.01); *B05D 3/144* (2013.01); *B05D 7/04* (2013.01); *B05D 2350/63* (2013.01); *C08J 2367/02* (2013.01); *C08J 2429/04* (2013.01); *C08J 2483/00* (2013.01); *H01J 2237/33* (2013.01)

(56) References Cited

FOREIGN PATENT DOCUMENTS

| | | |
|---|---|---|
| JP | 2790054 B | 8/1998 |
| JP | 2002-241703 | 8/2002 |
| JP | 2005-514487 | 5/2005 |
| JP | 2005-231039 | 9/2005 |
| JP | 2006-012431 | 1/2006 |
| JP | 2007-090663 | 4/2007 |
| JP | 2007-144783 | 6/2007 |
| JP | 2009-523892 | 6/2009 |
| JP | 2009-248454 | 10/2009 |
| JP | 2010-000447 | 1/2010 |
| JP | 2011-513563 | 4/2011 |
| JP | 4924806 B | 4/2012 |
| WO | 2009/123200 | 10/2009 |

OTHER PUBLICATIONS

Seong Woo Kim "Preparation and barrier property of poly(vinyl alcohol)/SiO2 hybrid coating films" Korean K. Chem. Eng. 2008, 25(5) 1195-1200. (Year: 2008).*

Tenkayala, et at., "Synthesis and Characterization of Poly(vinyl alcohol)/Water Glass (SiO2) Nano-Hybrids via Sol-Gel Process", Journal of Applied Polymer Science, 2010, vol. 117, No. 6, pp. 3533-3538.

International Preliminary Report on Patentability issued in International Application No. PCT/JP2015/059705, dated Oct. 4, 2016, 8 pages.

Office Action issued in counterpart Chinese Patent Application No. 201580018043.5, dated Jan. 30, 2018, 10 pages with an English translation.

Office Action issued in counterpart Japanese Application No. 2014-073309, dated Mar. 28, 2018, 12 pages with an English translation.

* cited by examiner

Silica mesh structure

SC: Silane coupling agent

GAS BARRIER FILM AND METHOD FOR PRODUCING IT

TECHNICAL FIELD

The present invention is an invention relating to a gas barrier film and a method for producing it, and more specifically, it relates to a gas barrier film provided with a base material film as the base material and a gas barrier coating film on at least one side thereof, the gas barrier film having an extremely high gas barrier property against oxygen gas, water vapor and the like, and having minimal reduction in the gas barrier property even after retort sterilization treatment, as well as to a method for producing it. The invention still further relates to a packaging material made of a gas barrier film that is useful for packaging of various materials to be packaged due to the excellent gas barrier property, and that is more simplified than the prior art.

The invention further relates to a gas barrier film provided with a base material film as the base material and a vapor deposition layer on at least one side thereof, and a gas barrier coating film on the vapor deposition layer, the gas barrier film having an extremely high gas barrier property against oxygen gas, water vapor and the like, and having minimal reduction in the gas barrier property even after retort sterilization treatment, as well as to a method for producing it. Moreover, it relates to a packaging material that is useful for packaging of various materials to be packaged due to the excellent gas barrier property, and especially to a gas barrier film for a packaging material to be used for boiling and retort sterilization packaging.

BACKGROUND ART

Various wrapping materials have been developed and proposed to date for packaging of a variety of articles such as foods and beverages, drugs and the like. In particular, for packaging of foods and beverages, drugs and the like, there is a need for packaging that employs packaging materials comprising a gas barrier laminated body having an effect of blocking infiltration of oxygen or water vapor from the external air which promotes putrefaction or alteration, or in other words, having an excellent gas barrier property. Various forms of gas barrier films have therefore been developed and proposed.

Gas barrier films comprising polymer resin materials with gas barrier properties, such as polyvinylidene chloride, polyvinyl alcohol and ethylene-vinyl alcohol copolymer, or plastic multilayer films laminated on other plastic base materials, as well as those laminated with aluminum foil which has an excellent barrier property as the most common barrier material, and metal vapor deposition films having a metal element such as aluminum vapor deposited on one side of a plastic film, are used as gas barrier materials in packaging materials.

However, materials employing plastic films suffer considerable reduction in gas barrier properties after boiling treatment or high temperature, high humidity retort treatment, depending on the use of the packaging, and gas barrier properties comparable to those of metal foils or metal vapor deposition layers have not been achieved. Moreover, they have low environmental friendliness, as they fail to decompose in the natural environment when discarded after use, and when incinerated they produce air pollution or require high temperatures.

Metal vapor deposition films laminated with aluminum foil or vapor deposition layers, on the other hand, are excellent gas barrier films, but have poor transparency due to the metal foil or metal vapor deposition layer, while also having low environmental friendliness as they are poorly suited for incineration and are difficult to treat as waste after their use.

Thus, in order to meet demands for gas barrier properties, and especially maintenance of excellent gas barrier properties after boiling treatment or high temperature, high humidity retort treatment, gas barrier films have been proposed that are formed by laminating a vapor deposition layer comprising an inorganic compound as a first layer on a base material comprising a polymer resin composition, and as a second layer, a gas barrier coating film obtained by coating and heat drying a coating agent whose main agent is an aqueous solution including a water-soluble polymer, and at least one from among (a) one or more alkoxides and/or hydrolysates thereof and/or (b) tin chloride, or a water/alcohol mixed solution (PTL 1).

This gas barrier coating film forms a chain or three-dimensional dendritic polymer after hydrolysis of the alkoxide, and reaction with the water-soluble polymer on the molecular level causes formation of a complex (Si—O—C bond), whereby a gas barrier property and resistance to moist heat are exhibited.

However, when an alkoxide hydrolyzes, the alkoxide undergoes condensation reaction immediately after the hydrolysis, and as time progresses, formation of coarse particles (gel masses) occurs, the coarse particle formation of the hydrolysate and water-soluble polymer producing steric hindrance by phase separation between the two, such that the film quality has numerous gaps as a complex, making it difficult to obtain a satisfactory gas barrier property, while under the high temperature and high humidity of boiling treatment or retort treatment, and after retort sterilization treatment, the water-soluble polymer swells and exhibits a reduced gas barrier property, so that the gas barrier film cannot be considered adequate.

There has also been proposed a technique for preventing swelling of hydrogen bonds formed between the water-soluble polymer and hydrolysate, by forming the gas barrier coating film using a sol-gel method and, as a modification to the gas barrier film for an improved gas barrier property, coating a 3-component mixed solution comprising an alkoxide hydrolysate, a polyvinyl alcohol and a silane coupling agent including an epoxy group as the organic functional group, onto an inorganic compound layer, and heat drying it to create a network structure of organic functional groups (PTL 2) (see FIG. 2).

However, in a gas barrier coating film formed from such a 3-component mixed solution, the silane coupling agent added to the mixed solution causes steric hindrance in the coating film so that the gas barrier property of the film itself obtained with the same formulation is inadequate compared to one without addition of a silane coupling agent, and the reduction in the gas barrier property after retort treatment remains a problem.

Thus, no gas barrier film yet exists that exhibits an adequate gas barrier property under the high temperature and high humidity of boiling treatment or retort treatment.

CITATION LIST

Patent Literature

[PTL 1] Japanese Patent Publication No. 2790054
[PTL 2] Japanese Patent Publication No. 4924806

SUMMARY OF INVENTION

Technical Problem

The present invention has been accomplished in light of the problem described above, and the object of the invention is to provide a gas barrier film having a very high gas barrier property against oxygen and water vapor, not only in ordinary environments but even under the high temperature and high humidity of boiling treatment or retort treatment, and having an excellent gas barrier property with minimal reduction in the gas barrier property even after retort sterilization treatment.

Solution to Problem

The present inventors have conducted diligent research with the aim of improving a gas barrier coating film by the conventionally used sol-gel method for multilayering of a gas barrier layer, and of forming a gas barrier multilayer film that exhibits more excellent gas barrier performance, in order to obtain and maintain an excellent gas barrier property even with boiling treatment and under high temperature and high humidity, and after retort sterilization treatment.

Based on analysis of gas barrier coating films, it was considered that, in the formation of a gas barrier coating film with an organic-inorganic composite material system by a conventional sol-gel method, as chain or three-dimensional dendritic polymers are successively formed after hydrolysis of alkoxides, the hydrolysis product simultaneously undergoes condensation reaction immediately after hydrolysis, and with the passage of time, the bonded states of the silicon atoms are altered, progressing to coarse particles (the bonded states of the silicon atoms described hereunder are altered to a Q4 structure), the hydrolysate and water-soluble polymer that have formed coarse particles becoming phase separated and creating a structure with numerous gaps, and the gas barrier property is thus reduced.

Furthermore, since the gas barrier coating film formed from the inorganic alkoxysilane hydrolysate and the co-present organic water-soluble polymer exhibits a reduced and deteriorated gas barrier property either during moist heat treatment such as boiling treatment or retort treatment, or after moist heat treatment, the cause was concluded to be the organic water-soluble polymer, suggesting that the state in which the water-soluble polymer is present in the gas barrier coating film affects the reduction in the gas barrier property.

Moreover, it was concluded that the process of formation of the gas barrier coating film is important for creating a gas barrier coating film having a more uniform, stable and dense coating film structure than the prior art, and is indispensable for controlling the sol-gel reaction forming the gas barrier coating film.

The object of the invention has been accomplished by establishing a means of controlling a hydrolysis system that can form a gas barrier coating film without producing phase separation of the alkoxysilane hydrolysate and water-soluble polymer by alkoxide hydrolysis, while allowing the alkoxysilane hydrolysate and water-soluble polymer to be stably held and present in the coating film without deterioration in the gas barrier property of the gas barrier coating film even with moist heat treatment and without phase separation, to obtain a dense coating film structure.

Specifically, the present invention, focusing on the bonded state of the silicon atoms in the alkoxysilane hydrolysate and the crystal state of the water-soluble polymer that is co-present, employs a gas barrier coating film that, first, allows formation of a network structure that can incorporate the water-soluble polymer by controlling the type of alkoxysilane hydrolysate, while also taking up and dispersing the crystalline water-soluble polymer in the network structure that is formed, forming a film structure that uniformly holds the crystalline water-soluble polymer.

Furthermore, it provides a gas barrier film having the aforementioned coating film formed on a base material, with the base material film and the gas barrier coating film laminated in a closely bonded manner.

Moreover, it provides a gas barrier film in which the aforementioned coating film is formed on an aluminum oxide vapor deposition film provided on a base material, wherein the aluminum oxide vapor deposition film on the base material film, and the gas barrier coating film, are laminated in a closely bonded manner.

The present invention also focuses on improving the degree of crystallinity to help prevent deterioration of the gas barrier property even with moist heat treatment such as boiling treatment or retort treatment, using a crystalline water-soluble polymer and improving the degree of crystallinity of the crystalline water-soluble polymer, wherein the water-soluble polymer is incorporated, dispersed and held in a network structure, providing a gas barrier coating film with a nanocomposite film comprising a network structure with uniform dispersion in the network structure as polymer microcrystals of the water-soluble polymer (see FIG. 1), wherein the gas barrier coating film is formed on a base material or aluminum oxide vapor deposition film to produce a gas barrier film.

It was found that the present invention exhibits an excellent gas barrier property without reduction and deterioration of the gas barrier property even when subjected to moist heat treatment such as boiling treatment or retort treatment, or after moist heat treatment, and can solve the aforementioned problem, by a gas barrier film formed from a gas barrier coating film having a nanocomposite film with a uniform, stable and dense coating film structure, by a step of coating an alkoxysilane hydrolysis solution on a base material or an aluminum oxide vapor deposition layer to form a gas barrier coating layer, as mentioned above, removing the solvent by heat treatment (a first heat treatment), to form a uniform and stable coating film with the crystalline water-soluble polymer dispersed in the network structure of siloxane bonds, and a step of improving the degree of crystallinity of the crystalline water-soluble polymer dispersed and arranged in the network structure by a second heat treatment, to produce a gas barrier coating film with a coating film structure having a nanocomposite film with the polymer microcrystals incorporated in the mesh of the network structure, and the invention has thus been completed.

A "network structure of siloxane bonds" includes a network structure of siloxane bonds in which $Si(OR)_4$ is hydrolyzed to $Si(OH)_4$, by hydrolysis of the alkoxide as the starting substance used for the sol-gel method, and condensation reaction of $Si(OH)_4$ proceeds in parallel, forming 3-membered rings (610 $cm^{-1}$), 4-membered rings (495 $cm^{-1}$) and a random network structure.

Here, the network structure of siloxane bonds means a random network structure, whereas a 4-membered ring structure is a regular network structure formed by condensation reaction of all of the hydroxyl groups on the silicon atoms of the alkoxide hydrolysate, which is micronized, while a 3-membered ring structure is due to structural defects, and these do not contribute to formation of the random network structure of the invention, and are not included in the network structure of the invention.

The network structure of siloxane bonds of the invention, as the observed skeletal structure, can be confirmed by obtaining the Raman spectrum by Raman spectroscopy, separating the waveforms and determining the assignment of Raman bands. Among the Raman bands of the Raman spectrum, straight-chain polysiloxane (488 cm$^{-1}$) the $SiO_2$ 4-membered ring structure (495 cm$^{-1}$) and the Si—O—Si bond network structure (425 cm$^{-1}$), which do not contribute to the network structure, may be observed.

According to the invention, these Raman spectra were used as indices of the size of the network structure. Specifically, the ratio ($A_{425}/A_{490}$) of the area intensity for 425 cm$^{-1}$ ($A_{425}$) and the area intensity of 490 cm$^{-1}$ ($A_{490}$) was used as an index.

When an alkoxide represented by the general formula $Si(OR)_4$ (where R is an alkyl group) is used as the starting substance in a sol-gel method, sol-gel reaction is conducted after hydrolysis, whereby there is generated a structure in which, of the 4 bonding sites of Si, n number (n=an integer of 1 to 4) of bonding sites form siloxane bonds (Si—O—Si bonds), and a mixture thereof results.

Where n number of bonding sites are siloxane bonds among the bonding sites, this will be referred to as a Qn structure.

The structure having siloxane bonds formed by sol-gel reaction undergoes condensation reaction in the order Q1→Q2→Q3→Q4 for the bonded states of the silicon atoms, such that the bonded states are altered, and basically the alkoxysilane hydrolytic condensate is a mixed system of the structures Q1, Q2, Q3 and Q4.

[Chemical Formula 1]

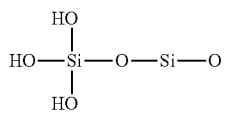

Q1

[Chemical Formula 2]

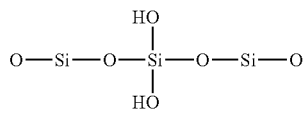

Q2

[Chemical Formula 3]

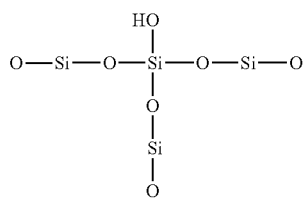

Q3

[Chemical Formula 4]

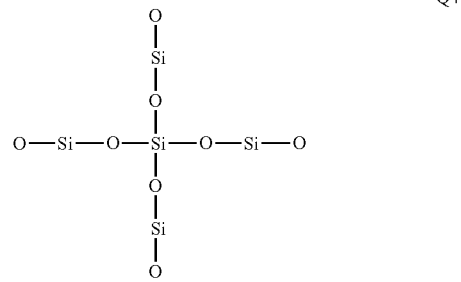

Q4

An alkoxysilane hydrolytic condensate having the structures Q1-Q4, which are the alkoxide hydrolysate and its condensates, have the following proportions for the Q1-Q4 structures, calculated based on analysis of the bonded states of the silicon atoms.

For this purpose, solid $^{29}$Si NMR measurement was conducted using a 90° pulse, the simple $^{29}$Si nuclear relaxation time $T_1$ being measured by DD/MAS, and after determining the quantitative conditions, the pulse repetition time was set to at least 3 times $T_1$, and the spectrum for the quantitation was obtained.

By waveform separation of the obtained spectrum, the peak area ratios were calculated for each structure as Q2 structure: −92 ppm, Q3 structure: −101 ppm, Q4 structure: −110 to −111 ppm, and each alkoxysilane hydrolytic condensate was evaluated by a method of quantification, as the Si component ratio of each structure.

The polymer microcrystals of the invention are formed with the crystalline water-soluble polymer trapped in the mesh formed in the network structure by heat treatment or the like during the process of forming the network structure of siloxane bonds as a random structure, and the crystalline water-soluble polymer is crystallized by formation of hydrogen bonds within the molecules or between molecules, thereby increasing the degree of crystallinity.

Those trapped in the network structure of siloxane bonds as polymer microcrystals can be confirmed by analysis of the state in which the water-soluble polymer is present.

For evaluation of the state in which the water-soluble polymer is present, since the gas barrier coating film formed by the sol-gel method of the invention has a structure incorporating microcrystals of the water-soluble polymer that has crystallized in the mesh of the siloxane network structure, with focus on the organic components in the coating film, the NMR spectrum is obtained by $^{13}$CCP/MAS using solid $^{13}$C-NMR measurement, waveform separation is performed and the higher-order structure is analyzed, while the hydrogen relaxation time due to molecular mobility is measured, and changes in the hydrogen relaxation time are used to determine the state in which the crystallized water-soluble polymer is present.

Specifically, the present invention requires, as an improved gas barrier coating film, the use of a barrier coating agent which is the condensation reaction product from mixing an alkoxysilane hydrolysis product, formed by hydrolysis of an alkoxysilane starting material, wherein the siloxane bonds are represented by the general formula Si(OR)n (where R is a C1 to 8 alkyl group, and n is an integer of 1 to 4 since the valence of Si is 4), with a crystalline water-soluble polymer, to form a gas barrier coating film having a nanocomposite film comprising dispersed polymer microcrystals and a network structure of siloxane bonds stably holding them.

Specifically, the invention forms an alkoxysilane hydrolytic condensate in which the proportion of silicon atom bonded states with Q1 and Q2 structures upon hydrolysis is at least 60% of the total silicon atoms (hereunder referred to as "partial hydrolytic condensate"), and immediately mixes it with a polyvinyl alcohol having crystallinity as a water-soluble polymer, to form a coexisting barrier coating agent.

According to the invention, the barrier coating agent is subsequently coated directly onto a base material made of a polymer resin composition, or onto the vapor deposition layer of a base material having an aluminum oxide vapor deposition layer, to form a coating film, after which it is subjected to heat treatment at least twice to remove the solvent from the coating layer and form a coating film, whereby drying treatment and heat treatment causes condensation of the hydrolysis product so that large silica particles are not formed, resulting in formation of a nanocomposite film having a dense mesh structure (Si—O—Si bonds) in which the crystalline water-soluble polymer is stably dispersed and held in the network structure of siloxane bonds, as a gas barrier film. According to the invention, the gas barrier coating film has a nanocomposite film structure, allowing a gas barrier film to be obtained according to the object of the invention.

According to the invention, upon mixture with a water-soluble polymer in a state of at least 60% alkoxysilane hydrolytic condensate with Q1 and Q2 structures, i.e. a partial hydrolytic condensate, the reaction can take place in a state with as few Q3 and Q4 structures as possible, which form coarse particles as complexes, so that a structure with many gaps does not form.

If the alkoxysilane hydrolytic condensate with Q1 and Q2 structures is less than 60%, a structure with many gaps will result, and therefore the water-soluble polymer will tend to swell under the high temperature and high humidity of boiling treatment or retort treatment, lowering the gas barrier property and being less than satisfactory.

In the gas barrier film of the invention, it is a requirement for an improved gas barrier coating film that the nanocomposite film of the gas barrier coating film has a different coating film structure than that formed by a conventional sol-gel method, when the bonded states of the silicon atoms in the film are analyzed by laser Raman spectroscopy, having a nanocomposite film structure where the peak due to the network structure (425 cm$^{-1}$) is predominant, and that there is formed an advanced network structure wherein the ratio A425/A490 between the area intensity (A425) of the peak (425 cm$^{-1}$) of the network structure and the area intensity (A490) of the peak (490 cm$^{-1}$) that does not contribute to the network structure, is between 2.0 and 3.0, inclusive.

An area intensity ratio of greater than 1.0 means that the proportion of the network structure of Si—O—Si bonds is greater than the proportion of fine particle Q4 structures, and a high concentration of alkoxysilane hydrolytic condensate having Q1 and Q2 structures that can form the network structure is maintained, being formed by condensation reaction.

As a condition for the condensation reaction of the alkoxysilane hydrolytic condensate, it must use an alkoxysilane hydrolytic condensation product with at least 60% Q1 and Q2 structures among the total silicon atoms, with a ratio of 2.0 or greater from the viewpoint of the physical properties required for the formed gas barrier coating film, while in theory it cannot be greater than 3.0 from the viewpoint of the proportion occupied by bonded states that do not contribute to the network structure, as the denominator of the area intensity ratio.

In the nanocomposite film of the invention, the crystalline water-soluble polymer is incorporated in the network structure of the nanocomposite film, existing as microcrystals of the water-soluble polymer with an improved degree of crystallinity, and with a higher proportion of highly-oriented water-soluble polymer.

In the nanocomposite film of the invention, when the state in which the water-soluble polymer is present in the film is analyzed by CP/MAS using solid $^{13}$C-NMR, evaluation may be made by waveform separation of the peak for 70 ppm due to the highly-oriented water-soluble polymer, from the methine peak (66 to 75 ppm).

With waveform separation of the peak for 70 ppm from the spectrum of the methine peak and calculation of the peak area ratio ($A_{70\ ppm}/A_{66\ to\ 75\ ppm}$)×100, the peak area ratio must be at least 40% in the nanocomposite film of the invention, for an improved gas barrier coating film.

Since crystallization of the water-soluble polymer in the nanocomposite film and incorporation as microcrystals results in a more excellent gas barrier property of the gas barrier coating film, the degree of crystallinity is preferably 100%.

According to the invention, the degree of crystallinity is preferably as close as possible to 100% by the treatment conditions of sufficient crystallization time, heating temperature, etc., so that the crystalline water-soluble polymer exists in a state dispersed as evenly as possible in the network structure, being crystallized by heat treatment and forming microcrystals that are incorporated in the network structure.

The nanocomposite film of the invention may also be specified by an index representing the molecular mobility of the water-soluble polymer, in order to further specify that the water-soluble polymer is microcrystallized in the film to become incorporated in the network structure, and the water-soluble polymer microcrystals are in a state incorporated in the network structure, the molecular mobility of the organic component of the water-soluble polymer being specified by the carbon nuclear relaxation time and the hydrogen nuclear relaxation time.

In particular, it is thought that the water-soluble polymer has high crystallinity and develops a rigid structure by having increased intramolecular hydrogen bonding and existing in the network structure, with a spin diffusion phenomenon occurring that converges to high molecular mobility $T_1$ or $T_1\rho$, which is reflected in the hydrogen nuclear relaxation time.

The nanocomposite film of the invention may also be specified by an index representing the molecular mobility of the water-soluble polymer, in order to further specify that the water-soluble polymer is microcrystallized in the film to become incorporated in the network structure, and the water-soluble polymer microcrystals are in a state incorporated in the network structure, the molecular mobility of the organic component of the water-soluble polymer being specified by the carbon nuclear relaxation time and the hydrogen nuclear relaxation time.

In particular, it is thought that the water-soluble polymer has high crystallinity and develops a rigid structure by having increased intramolecular hydrogen bonding and existing in the network structure, with a spin diffusion phenomenon occurring that converges to high molecular mobility $T_1$ or $T_1\rho$, which is reflected in the hydrogen nuclear relaxation time.

In a nanocomposite film formed from an alkoxysilane hydrolytic condensate and a crystalline water-soluble polymer according to the invention, the hydrogen relaxation time will not be greater than 3.0 msec.

In the nanocomposite film of the invention, in order to make distinction from the difference between a film with a high proportion of deterioration and a film with a low proportion of deterioration of the gas barrier property after retort treatment, that is, from a film in which the water-soluble polymer easily swells under the high temperature and high humidity in which boiling treatment or retort treatment is carried out, lowering the gas barrier property, due to a structure with numerous gaps in the gas barrier coating film, the hydrogen nuclear relaxation time of the nanocomposite film of the invention must be at least 2.0 msec.

Gas barrier coating films formed by conventional sol-gel methods have undergone phase separation of the mesh structure of the water-soluble polymer and the alkoxysilane hydrolytic condensate of siloxane bonds, and the film hardness has not been high, but the gas barrier coating film of the invention, wherein the gas barrier coating film forms a nanocomposite film, the nanocomposite film being formed while dispersing and stably holding the microcrystals of the water-soluble polymer in the network structure, is a hard coating film having a film hardness, obtained by measurement by nanoindentation, of 1.2 GPa or greater and a film hardness of 1.0 GPa or greater after retort treatment, and therefore the gas barrier property is not reduced under the high temperature and high humidity of boiling treatment or retort treatment, and high film hardness can be obtained.

According to the invention, the partial hydrolytic condensate is formed by hydrolysis of an alkoxysilane represented by the general formula Si(OR)n (where R is a C1 to 8 alkyl group, and n is an integer of 1 to 4 since the valence of Si is up to 4) under acidity in a range of pH 1.0 to 4.0, and preferably acidity in a range of pH 1.5 to 3.0. In addition, the bonded states of the silicon atoms of the alkoxysilane hydrolytic condensate are preferably controlled, and the hydrolytic condensate is obtained by hydrolysis under conditions with a liquid temperature of between 5° C. and 30° C.

According to the invention, by hydrolysis of an alkoxysilane under the aforementioned conditions, the alkoxysilane hydrolytic condensate is prepared so that the proportion of the bonded state of silicon atoms adopting Q1 and Q2 structures is 60% or greater of the total silicon atoms.

The invention is a gas barrier film obtained by coating a solution of the alkoxysilane partial hydrolytic condensate onto a base material film to form a coating layer, heat treating the coating film to remove the solvent in the coating layer, and further heat treating the coating film for further condensation reaction of the unreacted hydroxyl groups on the silicon atoms of the condensate in the coating film, forming a network structure with a mesh structure in which the Si—O—Si bonds are the basic lattice, so that there is formed, on the base material film, a gas barrier coating film composed so as to form a nanocomposite film in which the crystalline water-soluble polymer is incorporated in the formed coating film and microcrystals of the water-soluble polymer that have been crystallized in the mesh of the network structure are dispersed and stably held.

According to the invention, there is used an alkoxysilane hydrolytic condensate solution prepared so that the bonded states of the silicon atoms of the condensate before reaction of the alkoxysilane hydrolytic condensate have the (Q1+Q2) structures in an abundance ratio of at least 60% of the total silicon atoms, the (Q1+Q2) structures having high reactivity, the network structure being formed in the co-presence of the water-soluble polymer mixed with it, and the water-soluble polymer being incorporated in the mesh of the network structure during the process of forming the network structure.

The invention has a different barrier coating agent than one obtained by mixing an alkoxysilane hydrolytic condensate prepared by hydrolysis of an alkoxysilane and a water-soluble polymer according to a conventional sol-gel method, in that after forming the barrier coating agent by mixing the alkoxysilane hydrolytic condensate (a hydrolytic condensate with mainly Q1 and Q2 structures) and the water-soluble polymer during the process of producing the alkoxysilane hydrolytic condensate, it is coated directly onto a base material or onto a vapor deposition layer on the base material, and the formed gas barrier coating film is such that the reactive alkoxysilane hydrolytic condensate forms a network structure, the water-soluble polymer microcrystals being incorporated into the mesh during the course of its formation, to become a nanocomposite film structure. The production method of the invention has a major effect on the formed film structure and its physical properties, and yields a desirably improved gas barrier coating film.

The invention is also, in particular, a method for producing a gas barrier film with an improved gas barrier coating film formed by a step in which the barrier coating agent is coated directly on a base material or on an aluminum oxide vapor deposition layer, (first) heat treatment is carried out in a drying step to volatilize off the solvent from the formed coating layer for coating film formation treatment to form the coating film, and after the gas barrier coating film has been formed, (second) heat treatment is carried out to obtain a nanocomposite film structure with water-soluble polymer microcrystals incorporated into a mesh network structure.

More specifically, by conducting heat treatment under conditions with a lower temperature in the second heat treatment than the temperature of the first heat treatment in the drying step, a dense network structure is formed and microcrystallization of the crystalline water-soluble polymer is achieved.

According to the invention, the heat treatment in the drying step must be heating at 100° C. or higher in order to evaporate the water in the solvent, but the base material undergoes dimensional change by heat under temperature conditions exceeding the glass transition temperature ($T_{g\text{-}base}$) of the plastic film of the base material, and cracking may occur in the aluminum oxide layer, or the gas barrier property may be reduced, and therefore it is preferred for the treatment to be under temperature conditions in a range that does not affect the aluminum oxide layer.

The temperature conditions for the heat treatment will vary depending on the base material transport speed in the manufacturing line, the heating time, and the like, and therefore the temperature conditions are also set in consideration of the production conditions. The production method of the invention is most preferably carried out in a temperature range of up to 100° C. above the boiling point of the solvent ($T_{bp}$) in the solution.

For the invention, in the method for producing the gas barrier film, the second heat treatment is particularly important as it promotes polymer microcrystallization and is necessary for formation of the network structure, and the temperature conditions must be such as to cause microcrystallization of the water-soluble polymer to be incorporated in the nanocomposite film that is formed, while considering the glass transition temperature of the plastic film of the base material for the same reason as the heat treatment in the drying step, and therefore the heating must be to at least the glass transition temperature ($T_{g\text{-}coat}$) of the water-soluble polymer.

In the production method of the invention, the temperature range is most preferably at or above the glass transition temperature ($T_{g\text{-}coat}$) of the water-soluble polymer and up to the glass transition temperature ($T_{g\text{-}base}$) of the plastic film of the base material.

According to the invention, using polyvinyl alcohol as the crystalline water-soluble polymer, and tetraethoxysilane as the alkoxysilane, is preferred for the gas barrier coating film material.

According to the invention, when the condensate of the hydrolysate and the crystalline water-soluble polymer are mixed, as the composition for formation of the gas barrier coating film, the solution is preferably reacted by mixing with an acidic pH in the range of 1.5 to 4.0. Also, the liquid temperature of the solution during mixing is preferably controlled to no higher than 20° C.

Advantageous Effects of Invention

According to the invention it is possible to obtain a gas barrier coating film layer in a gas barrier film having adequate gas barrier properties against oxygen and water vapor, as required for ordinary environments.

Also according to the invention, it is possible to obtain a gas barrier layer in a gas barrier film which is a gas barrier multilayer film including two layers, an aluminum oxide vapor deposition layer and a gas barrier coating film, and having adequate gas barrier properties against oxygen and water vapor, as required for ordinary environments.

According to the invention, the gas barrier coating film of the invention differs from a gas barrier coating film formed by a conventional sol-gel method, in that the condensate of the alkoxysilane hydrolysate is mixed with the crystalline water-soluble polymer as a mixed solution in which the water-soluble polymer is copresent with a partial hydrolytic condensate wherein the proportion of hydrolysate condensate having Q1 and Q2 structures in the condensate of the alkoxysilane hydrolysate in 4 different bonded states, distinguished by the bonded states of the silicon atoms of the condensate, is at least 60% of the total silicon atoms, and is coated, dried and heat treated directly on a base material or on an aluminum oxide vapor deposition film, to condense the hydrolysis product and the condensate, or the condensate itself, without forming large silica particles, to form a nanocomposite film in which the polymer microcrystals are dispersed and stably held in the network structure of siloxane bonds having Si—O—Si bonds as the basic lattice that constrains molecular motion of the crystalline water-soluble polymer.

In other words, polycondensation reaction with a controlled proportion of partial hydrolytic condensate results in a form in which the crystallized water-soluble polymer with a high degree of crystallinity is disposed in a dispersed manner in the mesh of the network structure of siloxane bonds as the basic lattice, to result in a dense, hard film structure in which the crystallized water-soluble polymer and the siloxane bond mesh structure are arranged in a uniformly dispersed manner.

According to the invention it is possible to obtain a gas barrier film that, by improvement in the film structure of the gas barrier coating film, has a high gas barrier property compared to a conventional gas barrier coating film, and maintains hard film quality even in harsh conditions such as under the high temperature, high humidity of boiling treatment or retort treatment, and without swelling of the crystallized water-soluble polymer, and that has a stable gas barrier property with minimal deterioration of the gas barrier property.

According to the invention, heat treatment in the coating film-forming step by at least two heat treatments, namely heat treatment as the first coating film-forming step and second heat treatment for formation of the nanocomposite film, allows production efficiency to be maintained in the manufacturing line while allowing heat treatment immediately after coating of the barrier coating agent to be carried out as a treatment step similar to the prior art, so that existing equipment can be used.

Furthermore, a gas barrier coating film is formed retaining the alkoxysilane hydrolytic condensate active species for formation of the network structure, and it is possible to perform post-treatment in which formation of the nanocomposite film by the second heat treatment after separation from the manufacturing line, or in other words, formation of the network structure, and microcrystallization of the crystalline water-soluble polymer, are promoted and the microcrystals are incorporated into the mesh of the network structure, while heat treatment of the gas barrier film may be carried out for a heat treatment time of 1 to 300 hours and preferably 50 to 200 hours, which is sufficient to obtain improvement in the gas barrier property, to allow formation of a nanocomposite film with the gas barrier property efficiently improved without affecting production efficiency, which leads to improved product performance and increased production efficiency.

Moreover, by controlling the proportion of Q1 and Q2 structures as the bonded states of the silicon atoms of the condensate of the alkoxysilane hydrolysate used to form the gas barrier coating film, it is possible to control the film quality and gas barrier property of the gas barrier coating film, and to efficiently, reliably and easily produce an excellent gas barrier film.

In addition, since the gas barrier film of the invention not only has a high barrier property, but also maintains its high gas barrier property even under harsh conditions such as high temperature and high humidity, it can be used as an excellent packaging material suited for storage of contents.

DESCRIPTION OF EMBODIMENTS

Figure 1:
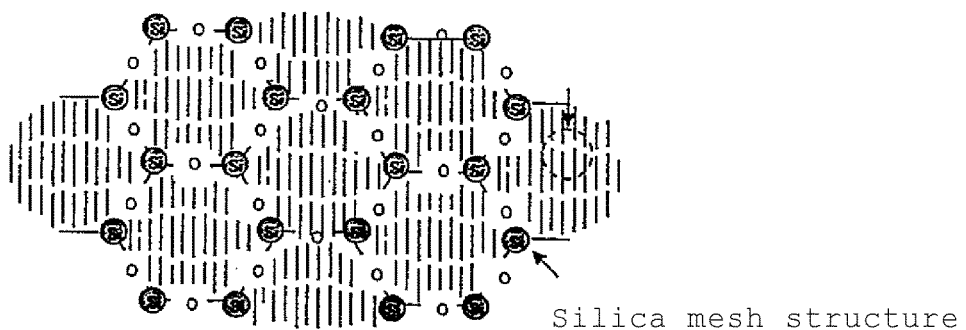
FIG. 1 is a schematic view of the film structure in the improved sol-gel method of the invention.
Figure 2:
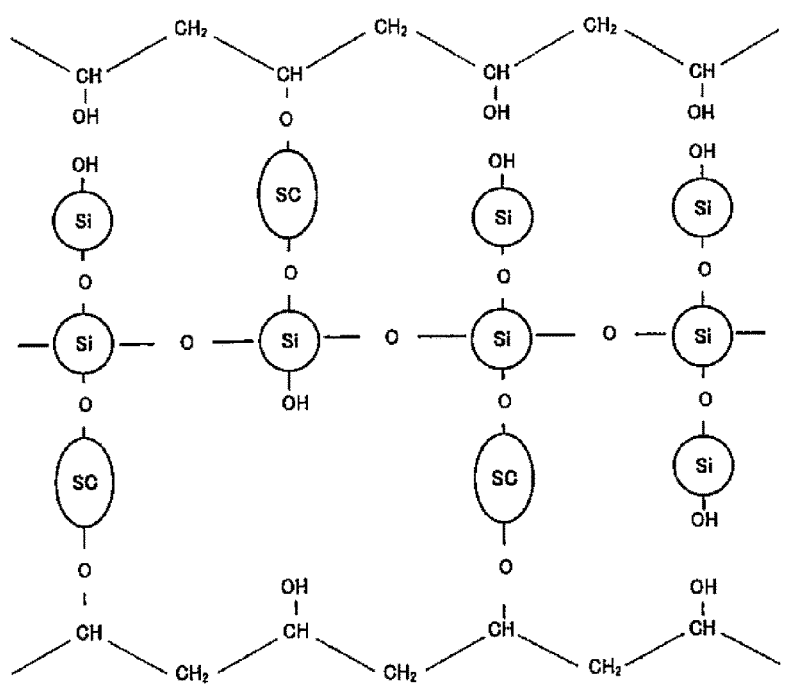
FIG. 2 is a schematic view of the film structure in a conventional sol-gel method.

The gas barrier film of the invention will now be explained in detail by way of suitable embodiments of the invention.

The gas barrier film of the invention has, as a basic structural feature, a basic structure which is a multilayer structure with a gas barrier coating film provided on one side of a base material film.

Also, the gas barrier film of the invention has, as another basic structural feature, a basic structure which is a multilayer structure in which an aluminum oxide vapor deposition layer is provided on one side of a base material film, and a gas barrier coating film is further provided on the aluminum oxide vapor deposition layer.

These examples are merely examples of the gas barrier film of the invention and are not intended to restrict the invention.

The materials and production methods used for the gas barrier film of the invention will now be explained.

First, the gas barrier coating film obtained by the improved sol-gel method as the feature of the gas barrier film of the invention will be explained in detail.

(Gas Barrier Coating Film)

The gas barrier coating film of the invention employs, as the material for formation of the gas barrier coating film, a starting material having the general formula Si(OR)n (where R is a C1 to 8 alkyl group, and an integer of 1 to 4 since the valence of Si is up to 4).

The gas barrier coating film has a structure formed by using a mixed solution whose components are a condensate of an alkoxysilane hydrolysate produced by hydrolysis of the starting material, and a crystalline water-soluble polymer, as the barrier coating agent with a gas barrier composition for formation of the coating layer that is to be the gas barrier coating film, and coating this barrier coating agent directly on a base material, or on the vapor deposition layer side of the aforementioned aluminum oxide vapor-deposited film, to form a coating layer, and it is formed by heating and removing the solvent from the coating layer and further subjecting the coating film to hardening treatment.

(Alkoxysilane)

In the alkoxysilane with the general formula Si(OR)n, as the starting material of the invention, R is a C1 to 8 alkyl group and n is an integer of 1 or greater, with n being up to 4 as the valence of Si. Specific examples for the alkyl group $R^1$ include methyl, ethyl, n-propyl, i-propyl, n-butyl, i-butyl, sec-butyl, t-butyl, n-hexyl and n-octyl. Specific examples for $R^2$ include methyl, ethyl, n-propyl, i-propyl, n-butyl and sec-butyl. These alkyl groups may be the same or different in the same molecule.

According to the invention, the alkoxysilane is preferably represented by $Si(OR)_4$ with R being a lower alkyl group, where R may be a methyl, ethyl, n-propyl or n-butyl group, and specific examples of such alkoxysilanes include tetramethoxysilane $Si(OCH_3)_4$, tetraethoxysilane $Si(OC_2H_5)_4$, tetrapropoxysilane $Si(OC_3H_7)_4$ and tetrabutoxysilane $Si(OC_4H_9)_4$.

According to the invention, two or more different alkoxysilanes may be used in combination. For example, by using a mixture of an alkoxysilane and a zirconium alkoxide, the toughness and heat resistance of the obtained multilayer film can be improved, and reduction in retort resistance of the film during stretching can be avoided. Also, by using an alkoxysilane and a titanium alkoxide in admixture, the thermal conductivity of the obtained film is lowered and the heat resistance of the base material is notably increased.

According to the invention, in order to realize a method in which a dense, hard nanocomposite film with an excellent gas barrier property is obtained while easily producing an excellent gas barrier coating film, the abundance ratio of $Q_1$-$Q_4$ condensates of the alkoxysilane hydrolysate is particularly important.

The alkoxide of the general formula Si(OR)n is hydrolyzed to yield an alkoxysilane hydrolysate. The hydrolysis proceeds rapidly in the presence of a catalyst, and all of the R alkyl groups of OR are hydrolyzed and converted to OH groups.

Using tetraethoxysilane $Si(OC_2H_5)_4$ as an example, the reaction proceeds according to the following formula (1). Here, the alkoxysilane starting material is represented as $(Q_0)$, and the hydrolysate of the alkoxysilane as $(Q_{01})$.

[Chemical Formula 5]

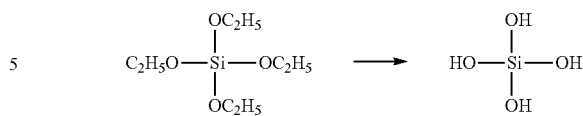

The produced alkoxysilane hydrolysate undergoes condensation reaction immediately after hydrolysis, and as time progresses, the bonded states of the silicon atoms are converted to Q1→Q2→Q3→Q4, producing an alkoxysilane hydrolytic condensate.

According to the invention, in order to obtain a gas barrier coating film having excellent film hardness by an improved sol-gel reaction, and comprising a nanocomposite film composed of dispersed polymer microcrystals and a network structure of siloxane bonds stably holding them, an important factor during preparation of the barrier coating agent as a mixed solution of the alkoxysilane hydrolytic condensates and the crystalline water-soluble polymer, for the alkoxysilane hydrolytic condensate, is the abundance ratio of Q1 and Q2 structures as bonded states of the silicon atoms that are the highly reactive bonded states with numerous hydroxyl groups.

According to the invention, the proportion of Q1 structure and Q2 structure of the bonded states of the silicon atoms of the alkoxysilane hydrolytic condensate is adjusted so as to be at least 60% of the total silicon atoms.

If the abundance ratio of Q1 and Q2 structures is lower than 60%, the abundance ratio of Q3 or Q4 structures will be increased, as the condensate formation reaction proceeds, and the Q3 and Q4 structures with large molecular structures will be dispersed in the hydrolytic condensate solution, similar to a conventional sol-gel method, at a higher abundance ratio, thereby impeding formation of a network structure with a dense, uniform mesh structure with the water-soluble polymer dispersed and uniformly held by condensation reaction of alkoxysilane hydrolytic condensate with Q1 and Q2 structures.

Furthermore, the water-soluble polymer will fail to be incorporated in the mesh of the mesh-like network structure, the water-soluble polymer will tend to swell, a dense, uniform film structure will not be obtainable, and sufficient improvement in the film hardness will fail to be achieved. As a result, it will be difficult to achieve the object of minimizing undesirable deterioration due to reduction in the gas barrier property after retort sterilization treatment.

No Si—O—C bonds were detected by experimentation for the invention.

(Water-Soluble Polymer)

According to the invention, in order to form a gas barrier coating film with a nanocomposite film structure having a balance between hard film structure and flexibility, the water-soluble polymer is necessary to provide flexibility to the gas barrier coating film when producing the barrier coating agent made of a gas barrier composition.

The water-soluble polymer of the invention may be a polyvinyl alcohol, ethylene-vinyl alcohol copolymer, acrylic acid-based resin, natural polymer-based methyl cellulose, carboxymethyl cellulose, cellulose nanofibers, polysaccharide or the like.

As polyvinyl alcohol-based resins there may generally be used those obtained by saponification of polyvinyl acetate. Polyvinyl alcohol-based resins are not particularly restricted, and may be partially saponified polyvinyl alcohol-based resins with several tens of percent of acetic acid group residues, or totally saponified polyvinyl alcohols without acetic acid group residues, or modified polyvinyl alcohol-based resins modified with OH groups.

Such polyvinyl alcohol-based resins include RS resins by Kuraray Co., Ltd., such as "RS-110" (saponification degree=99%, polymerization degree=1,000), "KURARAY POVAL LM-20SO" (saponification degree=40%, polymerization degree=2,000) by the same company, and "GOHSENOL NM-14" (saponification degree=99%, polymerization degree=1,400) by Nippon Synthetic Chemical Industry Co., Ltd.

According to the invention, a crystalline water-soluble polymer is most preferred as the water-soluble polymer. The crystalline water-soluble polymer is most preferably a polyvinyl alcohol-based resin, which easily forms a mixed film (nanocomposite film) of the alkoxysilane hydrolytic condensate and allows a crystallized structure to be easily adopted when incorporated into the mesh of the network structure.

A combination of polyvinyl alcohol and an ethylene/vinyl alcohol copolymer may also be used as the water-soluble polymer. This will notably improve the gas barrier property, water resistance and weather resistance of the obtained coating film. Furthermore, a plastic that is a combination of polyvinyl alcohol and an ethylene/vinyl alcohol copolymer not only has an excellent gas barrier property, water resistance and weather resistance, but also excellent hot water resistance and an excellent gas barrier property after hot water treatment. It may be one having suitable crystallinity by control of the proportion of polyvinyl alcohol.

As polyvinyl alcohol-based resins there may generally be used those obtained by saponification of polyvinyl acetate. Polyvinyl alcohol-based resins are not particularly restricted, and may be partially saponified polyvinyl alcohol-based resins with several tens of percent of acetic acid group residues, or totally saponified polyvinyl alcohols without acetic acid group residues, or modified polyvinyl alcohol-based resins modified with OH groups.

In regard to the saponification degree, the polyvinyl alcohol-based resin used must be at least one that has undergone the crystallization that improves the film hardness of the gas barrier coating film, and preferably the saponification degree is 70% or greater. Moreover, the polymerization degree may be in the range used for conventional sol-gel methods (about 100 to 5000).

Such polyvinyl alcohol-based resins include RS resins by Kuraray Co., Ltd., such as "RS-110" (saponification degree=99%, polymerization degree=1,000), "KURARAY POVAL LM-20SO" (saponification degree=40%, polymerization degree=2,000) by the same company, and "GOHSENOL NM-14" (saponification degree=99%, polymerization degree=1,400) by Nippon Synthetic Chemical Industry Co., Ltd.

(Preparation of Barrier Coating Agent)

Preparation of a barrier coating agent comprising a gas barrier composition used to form a gas barrier coating film having the nanocomposite film structure of the invention will now be explained.

The main agents used in the gas barrier composition of the invention are the aforementioned alkoxysilane condensate and water-soluble polymer. An alkoxysilane condensate has high reactivity, and it is therefore difficult to obtain a condensate that can form the desired gas barrier coating film using conventional methods.

According to the invention, therefore, an alkoxysilane (an alkoxide) is used as the starting material, and the alkoxysilane is hydrolyzed, obtaining the desired alkoxysilane condensate by controlling the hydrolysis reaction.

According to the invention, the alkoxysilane hydrolytic condensate is prepared by modification to the well-known sol-gel method.

The catalyst for hydrolysis of the alkoxysilane may be an acid, as employed in sol-gel methods. The acid used may be a mineral acid such as sulfuric acid, hydrochloric acid or nitric acid, or an organic acid such as acetic acid or tartaric acid.

Focusing on the fact that condensation reaction of the hydrolysate by a sol-gel method proceeds immediately after hydrolysis, and as time progresses, the bonded states of the silicon atoms alter in the manner Q1→Q2→Q3→Q4, proceeding to formation of coarse particles (gel masses), it is necessary to effect control in the initial hydrolysis so as to avoid a gas barrier composition with formation of numerous Q3 and Q4 structures for the bonded states of the silicon atoms.

According to the invention, therefore, in order to obtain a composite film structure wherein production of the alkoxysilane hydrolysate in the alkoxysilane hydrolysis is accelerated and the alkoxysilane hydrolytic condensate and water-soluble polymer are co-present, and the water-soluble polymer microcrystals are dispersed in the mesh of the network structure by the hydrolytic condensates, an acid catalyst is used to adjust the pH so that the alkoxysilane hydrolytic condensate solution is in an acidic state.

According to the invention, a weak acid results in a reaction system where some of the alkyl groups of the starting material remain, without progression to 100% hydrolysis, and multiple reactions proceed in the alkoxysilane hydrolytic condensate solution so that a solution composition with a complex mixture of condensates is formed, and therefore the acidity of the alkoxysilane hydrolytic condensate solution must be in a range of pH 1.0 to 4.0, and is preferably pH 1.5 to 3.0.

According to the invention, the reaction system of the alkoxysilane hydrolysis must be a system such that the reaction producing the alkoxysilane hydrolysate and its condensates takes place homogeneously through the entire barrier coating agent solution. Thus, a solvent system is used in which an alkoxysilane hydrolytic condensate solution is formed having the alkoxysilane, alcohol and alkoxysilane hydrolysates produced by alkoxysilane hydrolysis, and condensates thereof, uniformly dissolved.

According to the invention, an aqueous solvent system may be used as the solvent for the alkoxysilane hydrolytic condensate solution. Specifically, a water/alcohol-based mixed solvent may be used.

The alcohol used here is not particularly restricted so long as it does not interfere with preparation of the alkoxysilane condensate or the uniform mixed solution state, as the object of the invention, and examples include methyl alcohol, ethyl alcohol, n-propyl alcohol, isopropyl alcohol and n-butanol. The alcohol may also be a water/mixed alcohol-based solvent with a combination of two or more types.

According to the invention, for preparation of a solution with the desired composition of the condensate in the alkoxysilane hydrolytic condensate solution, it is necessary to conduct the hydrolysis while the temperature of the mixed solvent to which the acid catalyst has been added is kept in the range of 0° C. to 30° C. and preferably 5 to 30° C., in order to control the reaction. If the temperature of the reaction system is higher than 20° C., it will be difficult to prepare the alkoxysilane condensate composition solution including the desired alkoxysilane hydrolysate condensate since the hydrolysis itself is an exothermic reaction.

Preparation of the solution of the alkoxysilane hydrolytic condensate of the invention is accomplished, specifically, by using a water/alcohol-based mixed solvent for the reaction system and keeping the temperature of the mixed solvent system to no higher than 20° C., adding the acid catalyst to the mixed solvent, adjusting the pH to a range of 1.0 to 4.0 and preferably pH 1.5 to 3.0, and then mixing the alkoxysilane while keeping the temperature at no higher than 20° C., to produce an alkoxysilane hydrolysate, and then further adjusting it so that the desired alkoxysilane hydrolytic condensates are present in the prescribed amounts.

According to the invention, the water-soluble polymer is then mixed with an alkoxysilane hydrolytic condensate solution prepared in a water/alcohol mixed solvent, to prepare a mixed solution, for formation of a gas barrier property coating layer directly onto a base material or onto an aluminum oxide vapor deposition film formed on one side of a base material film, as the barrier coating agent for formation of the gas barrier coating film.

In order to form a gas barrier coating film with a uniform nanocomposite film, it is necessary to prepare the barrier coating agent in a uniform state. The water-soluble polymer is also in a solution state, prepared to allow its mixture with the solution of the alkoxysilane hydrolytic condensate.

Thus, the solvent of the water-soluble polymer is preferably in a homogeneously dissolved state in the barrier coating agent (coating solution) containing the alkoxide hydrolytic condensate, and any solvent may be used that forms a solution of the water-soluble polymer, so long as when it is mixed with the alkoxysilane hydrolytic condensate solution, the barrier coating agent can be kept in a uniform mixed solution state and the homogeneity is not impaired.

It is preferred to use the same solvent system as the solution of the alkoxysilane hydrolytic condensate, in order for the water-soluble polymer to be in homogeneous solution.

According to the invention, when the barrier coating agent comprising a mixed solution of the alkoxysilane hydrolytic condensate and the water-soluble polymer is prepared, their mixing ratio may be appropriately adjusted so that the weight ratio of the alkoxysilane hydrolytic condensate (as $SiO_2$) is in the range of 65% to 80%, inclusive.

If the weight ratio of the condensate is low, it will be difficult to form a condensate network structure with the water-soluble polymer uniformly dispersed in the gas barrier coating film, the denseness of the nanocomposite film structure will be inferior and it will also be difficult to obtain high film hardness.

Furthermore, the film hardness after retort treatment will be reduced and the gas barrier property will be reduced. If the proportion of the alkoxysilane hydrolytic condensate is too high, the gas barrier coating film will have excessively high film hardness, making it difficult to obtain a nanocomposite film with flexibility.

The solvent used to prepare the barrier coating agent by mixing the alkoxysilane hydrolytic condensate and the water-soluble polymer is a water/alcohol-based mixed solvent, the mixed solvent must have a water content of between 70% and 90%, inclusive, in order to maintain the reaction composition as a uniform mixed solution and keep the gas barrier coating layer homogeneous as a whole.

If the water content is outside of this range, further condensation of the alkoxysilane condensate will proceed with difficulty, and homogeneous dispersion of the mixed solution may be impaired, potentially affecting the homogeneity, denseness and film hardness of the nanocomposite film of the gas barrier coating film that is formed.

When the alkoxysilane hydrolytic condensate and the water-soluble polymer of the invention are mixed, similar to during preparation of the mixed solution of the alkoxysilane condensate, the barrier coating agent must be coated and the coating layer formed under conditions such that the pH of the mixed solution is in the range of 1.0 to 4.0 in order to control further reaction of the alkoxysilane condensate from Q1 structure to Q4 structure, and with the temperature of the solution controlled and maintained at from 5° C. to 30° C., and the compositional state of the alkoxysilane hydrolytic condensate of the barrier coating agent controlled.

(Formation of Gas Barrier Coating Film)

According to the invention, the barrier coating agent of the prepared mixed solution is coated by a common method directly onto a base material, or onto an aluminum oxide vapor deposition film formed on one side of a base material film, and the solvent is immediately heated and removed. The step of forming the coating film by removing the solvent by heat treatment forms a gas barrier coating film from the coating layer of the barrier coating agent containing the water-soluble polymer and the alkoxysilane hydrolytic condensate.

According to the invention, the method for coating the barrier coating agent may be, for example, application with coating means such as roll coating, with a gravure roll coater or the like, spray coating, spin coating, dipping, brushing, bar coating or applicator coating, by a single application or multiple applications, to form a coating layer to a dry film thickness of 0.01 to 30 μm and preferably 0.1 to 10 μm.

The formed coating layer is subjected to a coating film-forming step in which the solvent is removed by heat treatment. The coating film-forming step is a step of evaporating off the solvent, and heating at 100° C. or higher is necessary to evaporate off the water. If the glass transition temperature of the plastic film as the base material is represented as $T_{g\text{-}base}$, then temperature conditions with a heat treatment temperature that is very much higher than $T_{g\text{-}base}$ may result in dimensional change in the base material, producing strain or cracking in the aluminum oxide, and potentially resulting in reduction or deterioration of the gas barrier property.

Thus, the treatment is preferably with temperature conditions in a range that does not affect the aluminum oxide layer. For a roll-to-roll system, the temperature conditions for the heat treatment will vary depending on the base material transport speed in the manufacturing line, the heating time, and the like, and therefore the temperature conditions are also set in consideration of the production conditions. The production method of the invention is most preferably carried out in a temperature range of up to 100° C. above the boiling point of the solvent ($T_{bp}$) in the solution.

The heat treatment time is determined based on the thickness of the base material film in the continuous manufacturing line for the gas barrier film, the transport speed, the equipment conditions including the production apparatus for coating layer formation and the coating film-forming step, the production efficiency, etc. Since the supply roll for the continuously produced gas barrier film is to hold a product, when it is on the supply roll, it is necessary for it to be set so that the gas barrier coating film does not suffer damage or become detached. Usually, the step of forming the gas barrier coating film will require several seconds to several minutes.

There are no particular restrictions on the thickness of the gas barrier film on which the gas barrier coating film has been formed, but it is preferably 9 to 30 μm.

The gas barrier film of the invention has a layered structure with the formed gas barrier coating film, i.e. a gas barrier coating film wherein the coating layer in which the alkoxysilane hydrolytic condensate and the water-soluble polymer are co-present is heat treated, and condensation reaction from the Q1 structure to the Q4 structure of the alkoxysilane hydrolytic condensate in the coating film is further promoted, forming a network structure with a mesh structure in which the Si—O—Si bonds are the basic lattice, while having the hard dense film structure of a nanocomposite film in which the crystallized water-soluble polymer microcrystals are incorporated in the mesh of the network structure of siloxane bonds.

In order to form such a nanocomposite film, the invention requires heat treatment of the coating layer and removal of the solvent to form the gas barrier coating film, and following this coating film-forming step, further (second) heat treatment of the gas barrier coating film.

The temperature conditions for the second heat treatment must be at or above the glass transition point temperature ($T_{g\text{-}coat}$) of the polymer for crystallization of the crystalline water-soluble polymer, but if the heating temperature exceeds the glass transition temperature ($T_{g\text{-}base}$) of the base material film it can result in reduction and deterioration in the gas barrier property for the same reasons explained above, and therefore while the temperature for heat treatment must be at or above the glass transition temperature ($T_{g\text{-}coat}$) of the water-soluble polymer it must also be no higher than the glass transition temperature ($T_{g\text{-}base}$) of the plastic film of the base material, as the optimal temperature range.

According to the invention, the temperature for the second heat treatment is set in a range of at least the glass transition temperature ($T_{g\text{-}coat}$) of the water-soluble polymer and no higher than the glass transition temperature ($T_{g\text{-}base}$) of the plastic film of the base material, so that condensation reaction of the alkoxysilane hydrolytic condensate proceeds as a solid phase reaction of the gas barrier coating film of the gas barrier film under those heat treatment conditions, forming a network structure, while the water-soluble polymer is taken up into the mesh structure and the water-soluble polymer is crystallized, to obtain a gas barrier coating film with a hard, dense film structure, having a nanocomposite film with a uniform mesh structure in which the crystallized water-soluble polymer is dispersed throughout the entire coating film and the crystallized water-soluble polymer is incorporated into the mesh of the network structure.

According to the invention, since the temperature for the second heat treatment is a relatively low temperature, and in order to form an adequate network structure while trapping the water-soluble polymer in the mesh and forming hydrogen bonds within and between the molecules of the water-soluble polymer for microcrystallization, the heat treatment time must be longer than the heat treatment time for the first coating film-forming step, such as 1 to 300 hours and preferably 50 to 200 hours.

According to the invention, a plurality of coating layers consisting of two or more layers may be formed on the first coating film layer by repeating the coating procedure. The layered base material film on which the gas barrier composition has been coated is then subjected to heat treatment at a temperature at or above the glass transition temperature ($T_{g\text{-}coat}$) of the water-soluble polymer.

This allows production of a gas barrier film having one, two or more gas barrier coating films on the base material or the vapor deposition film by the barrier coating agent.

The base material film, or the aluminum oxide vapor deposition film, forming the multilayer film that is to form the gas barrier coating film of the invention, will now be explained.

(Base Material Film)

The base material film to be used for the invention is not particularly restricted, and the base material film used may be a plastic film alone or a layered film obtained using two or more different plastic materials, having excellent chemical or physical strength, able to withstand the conditions for forming the aluminum oxide vapor deposition film, not impairing the properties of the aluminum oxide and able to satisfactorily support the vapor deposition layer, or a film having a metal foil or metal oxide vapor deposition layer formed on the plastic base material, which is layered with another material such as a fabric such as a woven fabric or knitted fabric, or a paper base material.

Specifically, a transparent thermoplastic resin film may be used as the plastic film of the base material film, with appropriate selection according to the performance required in the field in which it is to be used.

As thermoplastic resins there may be used polyolefin-based resins such as polyethylene and polypropylene; polyester-based resins such as polyethylene terephthalate, polyethylene isophthalate, polyethylene-2,6-naphthalate and polybutylene terephthalate; polyether-based resins such as polyoxymethylene; polyamide-based resins such as nylon-6 and nylon-6,6; and vinyl-based resins such as polyvinyl alcohol and saponified ethylene-vinyl acetate copolymers.

These resins may be homopolymers or copolymers, or more than one resin may be melt mixed and molded into a film.

Of such plastic films, it is most preferred according to the invention to use a film or sheet of a polyester-based resin, polyolefin-based resin or polyamide-based resin.

According to the invention, the plastic film may be a film produced using a film forming method commonly used in the prior art, such as an extrusion method, T-die method, inflation method or cast molding method, wherein one or more of such plastic materials are made into a film, and the plastic film may be an unstretched film, or a uniaxially or biaxially stretched oriented film. The stretching method may be a known tenter system, or a tubular system may be utilized for stretching in a uniaxial direction or in biaxial directions.

According to the invention, the thickness of the plastic film may be as desired, selected within a range of from several micrometers to 300 μm, and it is preferably 6 to 100 μm and more preferably 9 to 50 μm.

If necessary, the plastic film may have various plastic mixtures or additives added for the purpose of, for example, improving or modifying the workability, heat resistance, weather resistance, mechanical properties, dimensional stability, oxidation resistance, slidability, releasability, flame retardance, mold resistance, electrical properties or strength of the film, in which case the amounts of addition may be as desired according to the purpose, in ranges that do not affect the gas barrier property.

According to the invention, the surface of the plastic film may be subjected to surface treatment as necessary, before layering the aluminum oxide, etc. for the purpose of improving adhesiveness with the nanocomposite thin-film or to improve adhesiveness with the aluminum oxide vapor deposition layer.

Surface treatment of the plastic film may be corona discharge treatment, ozone treatment, cold plasma treatment using oxygen gas or nitrogen gas, glow discharge treatment or physical or chemical treatment with a chemical agent, or a known pretreatment such as a primer coating agent layer, undercoat agent layer, anchor coat agent layer, adhesive layer, vapor deposition anchor coat agent layer or the like may be applied, for improved adhesiveness.

Moreover, according to the invention having a vapor deposition layer made of aluminum oxide provided on a base material, it is possible to provide a transparent vapor-deposited film for retort treatment that has excellent homogeneity without being affected by temperature or humidity, no reduction in adhesiveness between the vapor deposition film and the plastic base material, excellent hot water-resistant adhesiveness, and the ability to exhibit hot water resistance barrier performance, even when the base material is conveyed at high speed while forming the gas barrier layer and even with hot water retort treatment of the vapor deposition film with high-temperature water, while it is also possible to provide a gas barrier film that allows stable formation of the vapor deposition film and improved productivity.

In order to achieve this object, according to the invention, a continuous vapor-deposited film-forming apparatus is used wherein a pretreatment chamber containing a specific plasma pretreatment device and a film-forming chamber are separated, for plasma treatment of the plastic base material by a plasma pretreatment device that differs from conventional RIE plasma treatment, whereby an inorganic oxide vapor deposition film composed mainly of aluminum oxide is formed continuously and at high speed (360 m/min to 1000 m/min) on the plasma-pretreated surface.

This allows reinforcement of the hot water-resistant adhesiveness, with lamination strength of 3.0 N/15 mm or greater after hot water retort treatment at 121° C. for 60 minutes, without reduction in the adhesiveness at the interface between the plastic base material and the inorganic oxide vapor deposition film in the hot water retort treatment with high temperature water, and also allows production of a gas barrier film suitable for retort treatment, by layering a hot water-resistant gas barrier coating film on the formed vapor-deposited film.

According to the invention, plasma pretreatment of a plastic base material on the surface of a pretreatment roller is conducted under reduced pressure using a specific plasma pretreatment device, and a roller-type continuous vapor deposition film-forming apparatus is used in a continuous manner to form an inorganic oxide vapor deposition film on the pretreated surface of the plastic base material formed by the plasma treatment, over a film-forming roller, while a coating film with moist heat resistance and a gas barrier property is further layered on the formed vapor-deposited film, to form an inorganic oxide vapor deposition film including Al—C covalent bonds at the lamination interface between the plastic base material and the inorganic oxide vapor deposition film composed mainly of aluminum oxide, allowing a gas barrier film to be obtained which has adhesiveness between the plastic base material and the inorganic oxide vapor deposition film even with hot water retort treatment using high temperature water, and a bonding strength of 3.0 N/15 mm or greater upon measurement of the lamination strength after hot water retort treatment at 121° C. for 60 minutes.

The gas barrier film of the invention is produced by plasma pretreatment using a roller-type continuous plasma pretreatment device incorporating plasma pretreatment means that differs from a conventional publicly known RIE plasma treatment device or RIE treatment method, in that formation of a vapor deposition film is essential, and the plasma pretreatment structure has a plasma pretreatment roller that conveys a base material, and plasma supply means and magnetic field-forming means facing the pretreatment roller, the plasma being formed on the base material surface and concentrated, with a gap to entrap the plasma, wherein the supplied plasma source gas is introduced as plasma near the base material surface, while the plastic base material is subjected to plasma pretreatment by a roller-type plasma pretreatment device that allows plasma pretreatment while holding it with a desired voltage applied between the plasma pretreatment roller and the plasma supply means.

According to the invention there is employed a roller-type continuous vapor deposition film-forming apparatus having a structure in which a roller-type plasma pretreatment device and a roller-type vapor-deposited film-forming apparatus that forms an inorganic oxide vapor deposition film on the base material surface that has been plasma processed by the pretreatment device, are provided in series, wherein low-temperature plasma is used to maintain a powerful plasma state on the plasma treatment section while forming a powerful magnetic field, and the surface of a plastic material or the like is treated with the plasma to form a treated surface on the plastic base material, after which an inorganic oxide vapor deposition film composed mainly of aluminum oxide is formed on the treated surface of the plastic base material.

The roller-type continuous vapor deposition film-forming apparatus used to produce the gas barrier film of the invention is a multiple roller-type continuous vapor deposition film-forming apparatus that includes a pressure reduction chamber, conveying means that transports the base material in the pressure reduction chamber, means that isolates the pressure reduction chamber interior into at least a pretreatment chamber and a film-forming chamber, a pretreatment roller provided in the pressure reduction chamber for at least plasma treatment of the taken-up base material, a plurality of base material treatment rollers including a film-forming roller for film formation of a vapor deposition film on the base material pretreated surface, plasma pretreatment means comprising plasma supply means that supplies a plasma source gas composed of oxygen, nitrogen, carbon dioxide gas, or a mixture of one or more of these with argon, as plasma, and magnetic field-forming means, and vapor deposition film-forming means for forming a vapor deposition film on the plasma-pretreated base material surface, and the gas barrier film of the invention can be produced using a roller-type continuous vapor deposition film-forming apparatus which is a roller continuous vapor deposition film-forming apparatus as a roller plasma pretreatment device that is able to perform plasma pretreatment, having a plasma pretreatment structure with a plasma pretreatment roller and the plasma supply means and the magnetic field-forming means disposed facing the pretreatment roller, and a gap that traps plasma, whereby supplied plasma source gas is introduced as plasma near the base material surface and the plasma is formed in a concentrated manner on the plastic base material surface, with a desired voltage being applied between the plasma pretreatment roller and the plasma supply means.

According to the invention, the transparent vapor-deposited film has Al—C covalent bonds at the interface between the plastic base material and the inorganic oxide vapor deposition film composed mainly of aluminum oxide, by further layering of the hot water-resistant gas barrier coating film on the vapor-deposited film, to produce a gas barrier film having hot water-resistant adhesiveness that is reinforced over that of the prior art, at 3.0 N/15 mm or greater as the lamination strength between the plastic base material and the inorganic oxide vapor deposition film after hot water retort treatment at 121° C. for 60 minutes.

The invention has reinforced hot water-resistant adhesiveness between the plastic base material surface and the inorganic oxide vapor deposition film composed mainly of aluminum oxide even after hot water retort treatment of the gas barrier film with high temperature water, which not only improves the gas barrier property and prevents cracking, but also helps prevent detachment even after heat treatment such as retort treatment.

The gas barrier film of the invention can be continuously treated by plasma pretreatment and a film-forming treatment roller system, and therefore the vapor-deposited film with reinforced hot water-resistant adhesiveness can be treated at high speed (360 m/min to 1000 m/min).

The plasma pretreatment device for production of a gas barrier film according to the invention comprises plasma pretreatment means including plasma supply means and magnetic field-forming means, and a pretreatment roller for plasma pretreatment of the base material surface while conveying the base material. For plasma pretreatment, the plasma supply means supplies a plasma source gas comprising an inert gas such as argon as a plasma source gas that does not form a coating film, and oxygen, nitrogen, carbon dioxide gas, ethylene or the like, or a mixed gas of one of more of these gas components, as an active gas component.

The plasma source gas used may be one type of inert gas alone, or a mixture with one or more active gases. Preferably, a mixed gas of an inert gas such as argon and an active gas is supplied to the plasma supply means.

The plasma supply means is set at a position opposite the plasma pretreatment roller and functions as a counter electrode, while a high-frequency voltage is applied between the counter electrode and pretreatment roller by a plasma power source to form plasma, and the plasma is supplied near the supply port of the plasma supply means with plasma being introduced into the base material surface treatment region.

The gas supply means is mounted on the counter electrode side provided facing the pretreatment roller that conveys the base material, and it supplies gas toward the base material surface.

The magnetic field-forming means forms a magnetic field in order to create concentrated plasma on the plastic base material surface and hold the plasma while facilitating discharge, and a magnet is set at a location opposite the pretreatment roller in the plasma pretreatment chamber.

The magnetic field-forming means is set so as to combine the use of the counter electrode and plasma supply means with the magnet, for suitable concentration of the plasma in an efficient manner on the base material surface.

The plasma pretreatment means of the invention is configured so that a limited and surrounded gap is formed by the counter electrode/plasma supply means composing the plasma pretreatment means, the magnetic field-forming means and the pretreatment roller, in order to create plasma from the supplied plasma source gas and form plasma in a concentrated manner near the plastic base material being conveyed over the surface of the plasma pretreatment roller, the plasma being trapped within the space of the gap, forming a plasma pretreatment region at the plastic base material surface where the plasma density is increased and also controllable.

The plasma power source applies an alternating current voltage with a frequency of from 10 Hz to 50 MHz between the counter electrode, with the plasma pretreatment roller set as the ground level, and accomplishes input power control or impedance control.

A power source is connected between the plasma pretreatment roller and the plasma supply means, forming a condition in which a desired voltage is applied between them, and a pulse voltage of 200-1000 volts as the applied voltage is applied to the power source.

By superposing a direct-current voltage with a negative voltage of minus several hundred volts with the applied pulse voltage it is possible to perform maintenance of the electrode surface in the plasma, and this improves the power efficiency while allowing efficient plasma pretreatment to be accomplished.

According to the invention, the discharge impedance is increased by widening the distance between the plasma pretreatment roller and the counter electrode/plasma supply means which are situated as a pair. As a result, with application of constant power, the discharge voltage is high and the discharge current is low, such that the plasma ion implantation effect is increased and a film with high hot water-resistant adhesiveness can be formed.

Also, the flux density by the magnetic field-forming means is from 100 gauss to 10,000 gauss, and application of a magnetic field to the plasma traps the plasma near the surface of the plastic base material, and when held there it has reduced loss due to exhaust and seal leakage from the partitions, allowing pretreatment to be carried out at high efficiency with the desired plasma strength.

The plasma strength per unit area used in this case is between 100 and 8000 W·sec/m$^2$, since at 50 W·sec/m$^2$ or lower there is no effect of plasma pretreatment, while at 4000 W·sec/m$^2$ or higher the base material will tend to undergo degradation by plasma, such as ablation, breakage, coloration or burning.

The gas barrier film of the invention is a film having a vapor deposition film on a base material, with reinforced adhesiveness in hot water retort treatment with high temperature water, with a bonded structure at the interface between the plastic base material and the vapor-deposited film that contains Al—C covalent bonds, and it includes a gas barrier film wherein the gas barrier film has reinforced hot water-resistant adhesiveness with a bonding strength of 3.0 N/15 mm or greater as the lamination strength measured after hot water retort treatment at 121° C. for 60 minutes, by controlling the abundance of Al—C covalent bonds so as to be between 0.3% and 30% of the total bonds that include C, as measured by X-ray photoelectron spectroscopy (measuring conditions: X-ray source: AlKα, X-ray output: 120 W).

In addition, it includes a gas barrier film that has reinforced hot water-resistant adhesiveness, by control so that the Al/O ratio of the inorganic oxide vapor deposition film composed mainly of aluminum oxide from the interface between the film and the vapor-deposited film up to 3 nm toward the surface of the vapor-deposited film, is no greater than 1.0.

As an example of the vapor deposition apparatus having a pretreatment device using the aforementioned plasma, there may be used an apparatus as described in International Patent Publication No. WO2013/100073A1.

(Vapor Deposition Layer)

The vapor deposition layer composing the gas barrier film and packaging material of the invention is preferably made of an inorganic oxide such as silicon oxide or aluminum oxide, and the vapor deposition layer may be formed as one or more vapor deposition layers on at least one side of a base material film.

The method of forming the vapor deposition layer on at least one side of the base material film may be a suitable method selected from among physical vapor deposition and chemical vapor deposition methods.

A chemical vapor deposition method may be selected from among plasma CVD, plasma polymerization, thermal CVD processes and catalyst reactive CVD. A physical vapor deposition may be selected from among vapor deposition methods, sputtering, ion plating and ion beam assist methods. According to the invention it is possible to form a multilayer vapor deposition layer by combining both physical vapor deposition and chemical vapor deposition.

A specific example of forming an inorganic oxide thin-film by chemical vapor deposition will now be described.

A thin-film composed mainly of a silicon oxide vapor deposition film is made of a silicon compound having at least silicon and oxygen as constituent elements, and it also includes one or more from among carbon or hydrogen as trace constituent elements. The film thickness is preferably in the range of 100 to 500 angstrom. Such a silicon oxide thin-film used may be a vapor deposition film formed using an organic silicon compound as the starting material, by plasma chemical vapor deposition utilizing a low-temperature plasma generation apparatus, for example.

Examples of organic silicon compounds for this include 1,1,3,3-tetramethyldisiloxane, hexamethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane and octamethylcyclotetrasiloxane, as well as other compounds.

Among such organic silicon compounds, particularly preferred starting materials according to the invention are 1,1,3,3-tetramethyldisiloxane and hexamethyldisiloxane, from the viewpoint of handleability and properties of the formed vapor deposition film.

The method for forming the vapor deposition film using a physical vapor deposition method may be vacuum vapor deposition with aluminum or aluminum oxide as the target starting material, for the vaporization source, and heating it for vapor deposition, oxidation reaction vapor deposition using aluminum metal as the starting material and introducing oxygen for oxidation and vapor deposition, or plasma-assisted oxidation reaction vapor deposition in which the oxidation reaction is assisted with plasma.

According to the invention, a composite film comprising two or more vapor deposition films may be formed by different vapor deposition methods, combining physical vapor deposition and chemical vapor deposition.

A composite film comprising two or more vapor deposition films formed by different vapor deposition methods can be formed by first forming a dense and highly flexible vapor deposition film that is relatively resistant to formation of cracks, by chemical vapor deposition on the base material film, and then forming on this vapor deposition film a vapor deposition film obtained by vapor deposition of aluminum metal or aluminum oxide by physical vapor deposition, thereby forming a vapor deposition film comprising a composite film with two or more layers.

Or, conversely, a vapor deposition film comprising a composite film with two or more layers may be formed by first forming a vapor deposition film by vapor deposition of aluminum oxide on a base material film by physical vapor deposition, and then forming a vapor deposition film by vapor deposition of an organic silicon compound by chemical vapor deposition, which is highly dense and flexible and is relatively resistant to generation of cracks.

The vapor deposition layer of the invention is preferably a vapor deposition layer of aluminum oxide. The method of forming such a layer may be a method of forming an aluminum oxide vapor deposition film using a roll-to-roll continuous vapor deposition film-forming apparatus having a plasma pretreatment device. After subjecting one side of the base material film to plasma surface treatment, aluminum oxide or metal aluminum are used as vapor deposition starting materials, with an inert gas such as argon gas or helium gas as the carrier gas, and with oxygen gas or the like as an oxygen supply gas, for low-temperature plasma chemical vapor deposition using a low-temperature plasma generator, to form a vapor deposition layer comprising aluminum oxide.

The low-temperature plasma generator used in this case may be, for example, a generator of high-frequency plasma, pulse-wave plasma or microwave plasma, but in order to obtain plasma with stable high activity, it is preferred to use a generator based on a high-frequency plasma system.

According to the invention, the film thickness of the vapor deposition layer is preferably formed to a range of 50 to 4000 angstroms and preferably 100 to 1000 angstroms. If it is thinner than 50 angstroms, formation of the vapor deposition layer will be insufficient and the gas barrier property may be inadequate, while if it exceeds 4000 angstrom, it will become prone to cracking and the flexibility will be reduced.

(Packaging Material)

Since the gas barrier film of the invention has an excellent gas barrier property, exhibiting its gas barrier property even after hot water treatment and especially after high-pressure hot water treatment (retort treatment), as well as excellent flexibility, it is useful as a packaging material, and particularly as a film for food packaging.

Next, as an example of a packaging bag using this gas barrier film, a packaging material provided with a printed layer, laminating adhesive layer, heat-sealable resin layer in that order on the gas barrier coating film of the gas barrier film will be explained.

(Printed Layer)

As a printed layer, there may be used an ink composition composed mainly of 1 or 2 common ink vehicles, optionally with 1 or more additives such as plasticizers, stabilizers, antioxidants, light stabilizers, ultraviolet absorbers, curing agents, crosslinking agents, lubricants, antistatic agents or fillers as necessary, and addition of a coloring agent such as a dye or pigment, and thorough kneading of a solvent, diluent and the like.

Next, the ink composition may be used in a printing system such as gravure printing, offset printing, relief printing, screen printing, transfer printing or flexographic printing, for example, for printing of a desired printed pattern comprising characters, graphics, symbols or patterns on the gas barrier coating film of the gas barrier film, to form a printed pattern layer.

The ink vehicle may be a publicly known one, and for example, one or more from among linseed oil, tung oil, soybean oil, hydrocarbon oil, rosin, rosin esters, rosin-modified resins, shellac, alkyd resins, phenol-based resins, maleic acid resins, natural resins, hydrocarbon resins, polyvinyl chloride-based resins, polyvinyl acetate-based resins, polystyrene-based resins, polyvinyl butyral resins, acryl or methacryl-based resins, polyamide-based resins, polyester-based resins, polyurethane-based resins, epoxy-based resins, urea resins, melamine resins, aminoalkyd-based resins, nitrocellulose, ethyl cellulose, chlorinated rubber and cyclized rubber may be used.

(Laminating Adhesive Layer)

The laminating adhesive layer that is to compose the packaging material will now be described. The adhesive used to compose the laminating adhesive layer may be, for example, a polyvinyl acetate-based adhesive, a polyacrylic acid ester-based adhesive composed of a homopolymer of ethyl acrylate, butyl acrylate, 2-ethylhexyl ester or the like, or a copolymer of these with methyl methacrylate, acrylonitrile, styrene or the like, a cyano acrylate-based adhesive, an ethylene copolymer-based adhesive composed of a copolymer of ethylene with a monomer such as vinyl acetate, ethyl acrylate, acrylic acid or methacrylic acid, a cellulosic adhesive, a polyester-based adhesive, a polyamide-based adhesive, a polyimide-based adhesive, an amino resin-based adhesive made of a urea resin or melamine resin, a phenol resin-based adhesive, an epoxy-based adhesive, a polyurethane-based adhesive, a reactive (meth)acrylic-based adhesive, a rubber-based adhesive made of chloroprene rubber, nitrile rubber, styrene-butadiene rubber or the like, a silicone-based adhesive, or an inorganic adhesive made of an alkali metal silicate or low melting point glass.

The adhesive used may be in the form of an aqueous-type, solution-type, emulsion-type or dispersed composition, as a film, sheet, powder, solid or the like, and the bonding mechanism may be by chemical reaction, solvent volatilization, heat-fusion, thermocompression, or the like.

According to the invention, the entire surface including the printed layer may be coated with the adhesive by a coating method such as roll coating, gravure roll coating or kiss coating, or by a printing method, and then the solvent dried off to form a laminating adhesive layer, and preferably the coating coverage is about 0.1 to 10 g/m$^2$ (when dry).

(Heat-sealable Resin Layer)

The heat-sealable resin layer will now be explained.

The heat-sealable resin that is to compose the heat-sealable resin layer may be one that melts by heat to allow mutual fusion, and for example, a film or sheet of a resin comprising one or more resins from among low-density polyethylene, medium-density polyethylene, high-density polyethylene, straight-chain (linear) low-density polyethylene, polypropylene, ethylene-vinyl acetate copolymer, ionomer resins, polyolefin-based resins such as ethylene-ethyl acrylate copolymers, ethylene-acrylic acid copolymers, ethylene-methacrylic acid copolymers, ethylene-propylene copolymers, methylpentene polymers, polyethylene or polypropylene, and acid modified polyolefin-based resins that are modifications of these resins with unsaturated carboxylic acids such as acrylic acid, methacrylic acid, maleic anhydride or fumaric acid.

According to the invention, a resin film or sheet may be dry laminated on the surface of the laminating adhesive layer, to form a heat sealing resin layer.

The resin film or sheet used may be a monolayer or multilayer, and the thickness of the resin film or sheet may be 5 to 300 µm, and is preferably 10 to 110 µm.

In order to prevent generation of scuffing or cracking of the base material itself, or of the aluminum oxide vapor deposition film of the resin film or sheet having the aluminum oxide vapor deposition film during formation of a bag-like container body or the like, the thickness of the resin film or sheet is preferably a relatively large thickness, and specifically it may be 70 to 110 µm and is preferably 80 to 100 µm.

According to the invention, linear low-density polyethylene is especially preferred for use in the resin film or sheet. Linear low-density polyethylene, which has a cohesive property, has the advantage of low propagation of tearing and improved impact resistance, and since the inner layer is constantly in contact with the contents, it is effective for preventing deterioration of the resistance to environmental stress cracking.

Furthermore, according to the invention, another resin may be blended with linear low-density polyethylene, and for example, blending ethylene-butyne copolymer or the like will tend to result in slight impairment of the heat resistance and reduction in seal stability under high-temperature environments, but will provide the advantage of improved tearability and easier openability.

As linear low-density polyethylene there may be used, specifically, films or sheets of ethylene-α-olefin copolymers polymerized using metallocene catalysts.

As films or sheets of ethylene-α-olefin copolymers copolymerized using metallocene catalysts, there may be used, for example, films or sheets of ethylene-α-olefin copolymers obtained by copolymerization using catalysts that are combinations of metallocene complexes and alumoxanes, such as catalysts that are combinations of zirconocene dichloride and methylalumoxane, or in other words, metallocene catalysts.

Among the current metallocene catalysts those with heterogeneous active sites are known as multisite catalysts while those with homogeneous active sites are known as single-site catalysts.

Specifically, there may be used ethylene-α-olefin copolymer films copolymerized using metallocene catalysts such as "KARNEL", trade name of Mitsubishi Chemical Corp., "EVOLUE", trade name of Mitsui Petroleum Chemical Co., Ltd., "EXACT", trade name of Exxon Chemical Corp., USA, "AFFINITY" and "ENGAGE", trade names of Dow Chemical Corp.

The film or sheet forming the heat-sealable resin layer may be a monolayer or multilayer, with a thickness of 5 to 300 µm and preferably 10 to 100 µm.

According to the invention, using a film or sheet of an ethylene-α-olefin copolymer copolymerized using a metallocene catalyst, as the film of a resin having a heat sealing property, is advantageous in that low-temperature heat sealing is possible during production of a bag.

According to the invention, a resin film (intermediate base material) may be inserted between the laminating adhesive layer and the heat-sealable resin layer. Providing such an interlayer will improve the strength and pierce resistance. The resin film used may be a resin film or sheet with excellent mechanical, physical and chemical strength, excellent pierce resistance, and also excellent heat resistance, moisture proofness, pinhole resistance and transparency.

Specifically, there may be used, for example, polyester-based resins, polyamide-based resins, polyaramid-based resins, polypropylene-based resins, polycarbonate-based resins, polyacetal-based resins, fluorine-based resins, and other tough resin films or sheets.

According to the invention, the resin film or sheet may be used and inserted between the laminating adhesive layer and the heat-sealable resin layer, by dry lamination or the like using the laminating adhesive, for example.

The resin film or sheet used may be an unstretched film, or a stretched film or the like obtained by stretching in a uniaxial direction or biaxial direction.

Also according to the invention, the thickness of the resin film or sheet may be any thickness that can maintain the necessary minimum values for strength and pierce resistance, but if it is too thick the cost will be disadvantageously increased, whereas if it is too thin the strength and pierce resistance will be undesirably reduced.

According to the invention, the thickness is about 10 to 100 µm and preferably 12 to 50 µm, for the same reasons explained above.

Since a packaging bag will usually be placed under harsh physical and chemical conditions, the packaging material that is to form the packaging bag must exhibit high packaging suitability, and requires various properties including deformation strength, drop impact strength, pinhole resistance, heat resistance, sealing performance, quality maintenance, manageability and hygiene. Therefore, according to the invention, other materials that can provide such properties may be optionally used with the materials mentioned above.

Specific examples include optionally selected films or sheets of publicly known resins such as low-density polyethylene, medium-density polyethylene, high-density polyethylene, linear low-density polyethylene, polypropylene, ethylene-propylene copolymers, ethylene-vinyl acetate copolymers, ionomer resins, ethylene-ethyl acrylate copolymers, ethylene-acrylic acid or methacrylic acid copolymers, methylpentene polymers, polybutene-based resins, polyvinyl chloride-based resins, polyvinyl acetate-based resins, polyvinylidene chloride-based resins, vinyl-chloride/vinylidene chloride copolymers, poly(meth)acrylic-based resins, polyacrylnitrile-based resins, polystyrene-based resins, acrylonitrile-styrene copolymer (AS-based resins), acrylonitrile-butadiene-styrene copolymers (ABS-based resins), polyester-based resins, polyamide-based resins, polycarbonate-based resins, polyvinyl alcohol-based resins, saponified ethylene-vinyl acetate copolymers, fluorine-based resins, diene-based resins, polyacetal-based resins, polyurethane-based resins, nitrocellulose, and the like. Synthetic paper and the like may also be used.

According to the invention, the resin film or sheet used may be one that has been unstretched, or stretched in a uniaxial direction or in biaxial directions.

The thickness may be as desired, and may be selected in the range of several micrometers to 300 µm. Also according to the invention, the film or sheet may be a film in any form such as an extruded film, inflated film or coated film.

The present invention allows production of a packaging material for a packaging bag by, as explained above, first providing the gas barrier coating film of a gas barrier film with a gas barrier coating film, on one side of a base material film, or on an aluminum oxide vapor deposition film that has been formed on one side of a base material film, forming thereover a printed pattern layer and a laminating adhesive layer in that order using a method such as various types of coating or printing, or dry lamination, and further forming a heat-sealable resin layer on the laminating adhesive layer, additionally layering a film of a resin with excellent strength and pierce resistance (intermediate base material), between the laminating adhesive layer and the heat-sealable resin layer.

The invention will now be explained in greater detail with reference to examples, with the understanding that the invention is not limited by these examples.

According to the invention, analysis of silicon atom bonding states was conducted to measure the abundance ratio of Q1 structure, Q2 structure, etc. among the 4 bonded states of silicon atoms in the solution of the alkoxysilane hydrolytic condensate to be used for formation of the gas barrier coating film or in the gas barrier coating film.

The obtained gas barrier film was subjected to oxygen permeability and water vapor permeability measurement to evaluate the gas barrier property. The film hardness was also measured as an index for judging the surface denseness of the gas barrier coating film.

For each measurement after retort sterilization treatment, retort sterilization treatment of the gas barrier film of the example or comparative example was conducted using a hot water system, for a treatment time of 60 minutes under conditions with a treatment temperature of 121° C.±5° C., with similar measurement by the following measuring method.

The measured values for each example were obtained by the measuring means and procedures described below.
<Analysis of Silicon Bonding State>

Using a T-64000 by Jobin Yvon Co., measurement was conducted to determine the presence or absence of a silica network structure, with the measuring mode set to microscopic Raman spectroscopy. Since, in this measurement, there may be observed both straight-chain polysiloxane (488 cm$^{-1}$) and the 4-membered ring structure of $SiO_2$ (495 cm$^{-1}$), which do not contribute to the network structure, as well as the network structure of Si—O—Si bonds (425 cm$^{-1}$), the size of the network structure was indicated by the area intensity at 425 cm$^{-1}$ ($A_{425}$) and the area intensity at 490 cm$^1$ ($A_{490}$), and the interference portion ratio of 488 cm$^{-1}$ and 495 cm$^{-1}$ (=$A_{425}/A_{490}$).

Microscopic Raman spectroscopy can be carried out by a method which obtains information regarding chemical bonds and crystalline state by detection and spectroscopy of Raman scattered light produced by irradiation of laser light to the substance, and chemical analysis of each compound can be performed with high spatial resolution, regardless of its crystallinity or organic/inorganic nature.
(Analysis of Water-Soluble Polymer State)

The state of the crystalline polymer (crystalline water-soluble polymer) in the gas barrier coating film was analyzed from the NMR spectrum obtained by CP/MAS, using a CMX-300 by Chemagnetics, with a measuring nuclear frequency of 75.188829 MHz ($^{13}C$ nucleus), and waveform separation of the 70 ppm peak due to the highly-oriented water-soluble polymer from the methine peak (66 to 75 ppm), calculating the peak area ratio, and using it as an index of microcrystallinity, with reference being a structure having microcrystallinity with a 70 ppm peak area ratio of 40% or greater.

For the index representing the microcrystallinity of the water-soluble polymer in the gas barrier coating film, the molecular mobility of the water-soluble polymer was evaluated based on the hydrogen nuclear relaxation time obtained using the CMX-300, and the reference used was a structure having microcrystallinity with a hydrogen nuclear relaxation time of 2.0 msec or greater.

In the NMR spectrum of PVA based on CP/MAS, a methine peak and methylene peak are observed, with a shoulder peak being seen in the methine peak, the shoulder peak being derived from hydroxy-bonded methine participating in intramolecular hydrogen bonding with hydroxy groups at both ends (I: 75 ppm), hydroxy-bonded methine that participates in intramolecular hydrogen bonding only with hydroxy groups at one end (II: 70 ppm), and methine not contributing to intramolecular hydrogen bonding (III: 66 ppm).
<Measurement of Film Hardness>

The hardness or elastic modulus of the material is an important mechanical property determining the strength and durability of a product, and since for a thin-film it is not possible to obtain film-specific properties by conventional hardness testing methods, a T1950 Tribolindenter by Hysitron was used and the film hardness was calculated from the "load-deformation (indentation depth)" when an indenter was contacted with the gas barrier coating film and a load was applied.
(Measurement of Gas Barrier Properties)
<Measurement of Oxygen Permeability>

Measurement of the oxygen permeability was carried out according to JIS K7126, using a measuring device by Mocon, USA (device name: OX-TRAN2/21), under conditions with the obtained gas barrier film at a temperature of 23° C. and a humidity of 90% RH.

<Measurement of Water Vapor Permeability>

The water vapor permeability was measured according to JIS K7129, using a measuring device by Mocon, USA (device name: PERMATRAN3/33), with the obtained gas barrier film under the following two different conditions: 40° C. temperature, 90% RH humidity, and 50° C. temperature, 90% RH humidity.

EXAMPLES

The following Examples 1 to 5 and Comparative Examples 1 to 7 relate to inventions of a gas barrier film having a base material made of a polymer resin composition, on which is layered a nanocomposite film comprising dispersed polymer microcrystals and a network structure of siloxane bonds stably holding them.

Also, Examples 6 to 9 and Comparative Examples 8 to 14 relate to inventions of a gas barrier film having a base material made of a polymer resin composition with a vapor deposition layer made of aluminum oxide provided over it, there being layered on the vapor deposition layer, a nanocomposite film comprising dispersed polymer microcrystals and a network structure of siloxane bonds stably holding them.

Example 1

The gas barrier films used in the examples and comparative examples of the invention were produced in the following manner.

Using 12 μm-thick polyethylene terephthalate (P60 by Toray Co., Ltd.) (Tg: 90 to 100° C.) as the base material, a barrier coating agent prepared under the conditions described below was coated on the corona treated surface to a coating coverage of 0.3 g/m$^2$ using a gravure coater.

It was then subjected to a first heat treatment (drying treatment) at 110° C. for 30 seconds, and then to a second heat treatment at 85° C. for 72 hours, to form a gas barrier coating layer with a film thickness of 0.3 μm.

(Barrier Coating Agent)

After mixing 677 g of water, 117 g of isopropyl alcohol and 16 g of 0.5N hydrochloric acid, the solution was adjusted to pH 2.2 and 285 g of tetraethoxysilane was mixed therewith while cooling to a liquid temperature of 10° C., to prepare solution A. The bonded states of the silicon atoms in the solution were measured by DD/MAS using a CMX-300 by Chemagnetics, with a measuring nuclear frequency of 59.639191 MHz ($^{29}$C nucleus), giving the results: Q1 structure: 23.6%, Q2 structure: 49.5%.

A mixture of 70 g of polyvinyl alcohol with a saponification degree of ≥99% and a molecular weight of 2400 (Tg: 80° C.), 1540 g of water and 80 g of isopropyl alcohol was prepared as solution B.

As solution A was obtained, it was mixed with solution B at pH 2.2 while cooling to a liquid temperature of 10° C., to a solution A:solution B weight ratio of 6.5:3.5, and the obtained solution was used as the barrier coating agent.

Example 2

This was conducted by the same method as Example 1, except for preparation of the barrier coating agent, and the base material film was coated with a barrier coating agent prepared under the following conditions by coating with a gravure coater, after which it was heat treated under the same conditions as Example 1 to form a coating layer with a gas barrier property, to a film thickness of 0.3 μm.

(Barrier Coating Agent)

After mixing 677 g of water, 117 g of isopropyl alcohol and 16 g of 0.5N hydrochloric acid, the solution was adjusted to pH 2.7 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 12.1%, Q2 structure: 55.6%.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 2.7 while cooling to a liquid temperature of 10° C., to a weight ratio of 6.5:3.5, and the obtained solution was used as the barrier coating agent.

Example 3

This was conducted by the same method as Example 1, except for the method of preparing the barrier coating agent, the base material film being coated with a barrier coating agent prepared under the following conditions by coating with a gravure coater, after which it was heat treated under the same conditions as Example 1 to form a coating layer with a gas barrier property, to a film thickness of 0.3 μm. The Si bonded states in the solution were measured by DD/MAS using a CMX-300 by Chemagnetics, with a measuring nuclear frequency of 59.639191 MHz ($^{29}$C nucleus), giving the results: Q1 structure: 7.8%, Q2 structure: 53.9%.

(Barrier Coating Agent)

After mixing 677 g of water, 117 g of isopropyl alcohol and 16 g of 0.5N hydrochloric acid, the solution was adjusted to pH 2.4 and 285 g of tetraethoxysilane was mixed therewith while cooling to a liquid temperature of 25° C., to prepare solution A.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 3.0 while cooling to a liquid temperature of 20° C., to a weight ratio of 6.5:3.5, and the obtained solution was used as the barrier coating agent.

Example 4

This was conducted by the same method as Example 1, except for the method of preparing the barrier coating agent, the base material film being coated with a barrier coating agent prepared under the following conditions by coating with a gravure coater, after which it was heat treated under the same conditions as Example 1 to form a coating layer with a gas barrier property, to a film thickness of 0.3 μm.

(Barrier Coating Agent)

After mixing 677 g of water, 117 g of isopropyl alcohol and 16 g of 0.5N hydrochloric acid, the solution was adjusted to pH 2.2 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 23.6%, Q2 structure: 49.5%.

Solution B was prepared by mixing 70 g of ethylene-vinyl copolymer (SOARNOL DC3212 by Nippon Synthetic Chemical Industry Co., Ltd.) (Tg: 60° C.), 1540 g of water and 80 g of isopropyl alcohol.

As solution A was obtained, it was mixed with solution B at pH 2.2 while cooling to a liquid temperature of 10° C., to a solution A:solution B weight ratio of 6.5:3.5, and the obtained solution was used as the barrier coating agent.

Example 5

Using a 20 μm-thick biaxially stretched polypropylene film (FOP by Futamura Chemical Co., Ltd.) (Tg: 90° C.) as the base material, it was subjected to corona treatment, and the corona treated surface was coated with a barrier coating agent prepared by the same method and under the same conditions as Example 1, using a gravure coater, to form a coating layer with a gas barrier property, having a film thickness of 0.3 μm.

It was then subjected to a first heat treatment (drying treatment) at 100° C. for 30 seconds, and then to a second heat treatment at 85° C. for 72 hours, to form a gas barrier coating layer with a film thickness of 0.3 μm.

Comparative Example 1

This was conducted by the same method as Example 1, except that the second heat treatment after application of the barrier coating agent was not carried out, to form a coating layer with a gas barrier property, having a film thickness of 0.3 μm.

Comparative Example 2

This was conducted by the same method as Example 1, except that the second heat treatment conditions after application of the barrier coating agent were 55° C., 72 hours, to form a coating layer with a gas barrier property, having a film thickness of 0.3 μm.

Comparative Example 3

This was conducted by the same method as Example 1, except that the first heat treatment conditions after application of the barrier coating agent were 90° C., 30 seconds, to form a coating layer with a gas barrier property, having a film thickness of 0.3 μm.

Comparative Example 4

This was conducted by the same method as Example 1, except for the method of preparing the barrier coating agent, the base material film being coated with a barrier coating agent prepared under the following conditions by coating with a gravure coater, after which it was heat treated under the same conditions as Example 1 to form a coating layer with a gas barrier property, to a film thickness of 0.3 μm.
(Barrier Coating Agent)

After mixing 677 g of water, 117 g of isopropyl alcohol and 16 g of 0.5N hydrochloric acid, the solution was adjusted to pH 3.0 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 1.8%, Q2 structure: 57.1%.

A mixture of 70 g of polyvinyl alcohol with a saponification degree of ≥99% and a molecular weight of 2400, 1540 g of water, 80 g of isopropyl alcohol and 8 g of a silane coupling agent was prepared as solution B.

As solution A was obtained, it was mixed with solution B at pH 3.0 while cooling to a liquid temperature of 10° C., to a solution A:solution B weight ratio of 6.5:3.5, and the obtained solution was used as the barrier coating agent.

Comparative Example 5

The same barrier coating agent as Example 1 was coated with a gravure coater by the same method as Example 5, except that the second heat treatment was not carried out after application of the barrier coating agent, to form a coating layer with a gas barrier property, having a film thickness of 0.3 μm.

Comparative Example 6

This was conducted by the same method as Example 1, except for the method of preparing the barrier coating agent, the base material film being coated with a barrier coating agent prepared under the following conditions by coating with a gravure coater, after which it was heat treated under the same conditions as Example 1 to form a coating layer with a gas barrier property, to a film thickness of 0.3 μm.
(Barrier Coating Agent)

After mixing 179.2 g of 0.1N hydrochloric acid with 208 g of tetraethoxysilane, the mixture was stirred for 30 minutes to prepare hydrolyzed solution A with a solid content of 3 wt % (as $SiO_2$). The Si bonded states in the solution were measured by DD/MAS using a CMX-300 by Chemagnetics, with a measuring nuclear frequency of 59.639191 MHz ($^{29}$C nucleus), giving the results: Q1 structure: 2.3%, Q2 structure: 40.6%.

A mixture of 67 g of polyvinyl alcohol with a saponification degree of ≥99% and a molecular weight of 2400, 1540 g of water and 80 g of isopropyl alcohol was prepared as solution B.

As solution A was obtained, it was mixed with solution B to a solution A:solution B weight ratio of 6.0:4.0, and the obtained solution was used as the barrier coating agent.

Comparative Example 7

This was conducted by the same method as Example 1, except for the method of preparing the barrier coating agent, the base material film being coated with a barrier coating agent prepared under the following conditions by coating with a gravure coater, after which it was heat treated under the same conditions as Example 1 to form a coating layer with a gas barrier property, to a film thickness of 0.3 μm.
(Barrier Coating Agent)

After adding 72.1 g of 0.1N hydrochloric acid to 17.9 g of tetraethoxysilane and 10 g of methanol, the mixture was stirred for 30 minutes to prepare hydrolyzed solution A with a solid content of 5 wt % (as $SiO_2$).

The Si bonded states in the solution were measured by DD/MAS using a CMX-300 by Chemagnetics, with a measuring nuclear frequency of 59.639191 MHz ($^{29}$C nucleus), giving the results: Q1 structure: 0%, Q2 structure: 33.5%.

A mixture of 105.3 g of polyvinyl alcohol with a saponification degree of ≥99% and a molecular weight of 2400, 1900 g of water and 100 g of isopropyl alcohol was prepared as solution B.

Also, 1N hydrochloric acid was gradually added to a solution of γ-glycidoxypropyltrimethoxysilane and IPA, the mixture was stirred for 30 minutes, and after hydrolysis, hydrolysis was carried out with a solution of water/IPA=1/1, to prepare solution C having a solid content of 5 wt % (as $R^2Si(OH)_3$ weight ratio).

Solutions A, B and C were mixed at a weight ratio of 7.0:2.0:1.0, to obtain a solution as a barrier coating agent.

(Measurement and Evaluation of Gas Barrier Film of the Invention)

Table 1 shows the results of measurement for the coating film structure of the gas barrier coating films of the gas barrier films of the examples and comparative examples.

The nanocomposite films with coating film structures formed according to the invention were able to obtain a higher proportion of network structure formation than the gas barrier coating films of the comparative examples. Furthermore, as regards the effect on the abundance ratio of Q1 and Q2 structures in the barrier coating agents used to form the gas barrier coating films, by comparative analysis of the area intensity ratio of peaks obtained by laser Raman spectroscopic analysis of the Si bonded states shown in Table 1, with an abundance ratio of 60% for Q1 and Q2 structures as the boundary, it was shown that a greater network structure was clearly formed by those with a high abundance ratio of (Q1+Q2) structures (the Examples and Comparative Examples 1 to 3) than those with a low abundance ratio (Comparative Examples 4 and 5).

Furthermore, as regards the state of the water-soluble polymer in the gas barrier coating film structure, the 70 ppm peak area ratio was considerably larger in the examples than in the comparative examples, and more hydroxy groups participated in intramolecular hydrogen bonding in the water-soluble polymer, while the hydrogen nuclear relaxation time $T_1\rho$ reflecting the motion mode corresponding to the polymer main chain was longer in the examples than in the comparative examples, such that the molecular mobility was judged to be lower.

Based on these results, the gas barrier coating film formed by the improved sol-gel method of the invention has a high proportion of network structure formed, with advanced crystallization of the water-soluble polymer, which is assumed to be in a microcrystalline state, while the water-soluble polymer also has low molecular mobility, and is assumed to be incorporated and crystallized in the mesh of the network structure. Thus, the gas barrier coating film of the invention can be evaluated as forming a nanocomposite film comprising dispersed polymer microcrystals and a network of siloxane bonds stably holding them.

Furthermore, when the temperature for the second heat treatment and the heat treatment temperature for drying treatment are temperature conditions outside of the conditions of Example 1 of the invention, as in Comparative Examples 1 to 3, the proportion of network structure formed was lower compared to Example 1, and the proportion of microcrystallized water-soluble polymer did not increase and high molecular mobility remained, whereby it could be evaluated that a low proportion of water-soluble polymer was incorporated into the network.

TABLE 1

| | Q1, Q2 abundance ratios upon mixing solution A and solution B [%] | | $A_{425}/A_{490}$ [Area intensity ratio] | 70 ppm peak area ratio [%] | Hydrogen nuclear relaxation time $HT_{1\rho}$ [msec] |
|---|---|---|---|---|---|
| | Q1 | Q2 | | | |
| Example 1 | 23.6 | 49.5 | 2.53 | 48.7 | 2.3 |
| Example 2 | 12.1 | 55.6 | 2.68 | 46.1 | 2.0 |
| Example 3 | 7.8 | 53.9 | 2.75 | 45.0 | 2.0 |
| Example 4 | 23.6 | 49.5 | 2.51 | 43.6 | 2.2 |
| Example 5 | 23.6 | 49.5 | 2.50 | 47.9 | 2.1 |
| Comp. Ex. 1 | 23.6 | 49.5 | 1.13 | 9.6 | 0.2 |
| Comp. Ex. 2 | 23.6 | 49.5 | 1.66 | 25.4 | 0.7 |
| Comp. Ex. 3 | 23.6 | 49.5 | 1.79 | 24.3 | 1.2 |
| Comp. Ex. 4 | 1.8 | 57.1 | 1.53 | 23.5 | 0.9 |
| Comp. Ex. 5 | 23.6 | 49.5 | 1.30 | 18.1 | 0.5 |
| Comp. Ex. 6 | 2.3 | 40.6 | 1.44 | 19.5 | 0.7 |
| Comp. Ex. 7 | 0.0 | 33.5 | 1.29 | 1.29 | 1.8 |

Table 2 shows the results of analysis of the physical properties of gas barrier coating films of the invention.

The gas barrier coating films formed in the examples of the invention had high gas barrier properties for both oxygen and water vapor, and low deterioration of the gas barrier properties even under high temperature and high humidity. The causative factor for this was clearly that the formed gas barrier coating film had low reduction in film hardness even under high temperature and high humidity, and the nanocomposite film of the invention had been formed as a coating film that was dense and hard with an excellent gas barrier property.

The physical properties of the gas barrier coating films of the invention were compared by changing influential factors in contrast with the examples, including not only the composition but also the pH, the liquid temperature during reaction of the mixed solution, and the heating temperature for volatilization of the solvent, to allow evaluation of the abundance ratio, film hardness and oxygen or water vapor permeability.

TABLE 2

| | Q1, Q2 abundance ratios upon mixing solution A and solution B [%] | | Film hardness [GPa] | | Oxygen permeability [ml/m² · day · Pa] | | Water vapor permeability [g/m² · day] | |
|---|---|---|---|---|---|---|---|---|
| | Q1 | Q2 | Before storage | After storage | Before storage | After storage | Before storage | After storage |
| Example 1 | 23.6 | 49.5 | 1.8 | 1.8 | 0.4 | 0.4 | 0.4 | 0.4 |
| Example 2 | 12.1 | 55.6 | 1.7 | 1.7 | 0.4 | 0.4 | 0.4 | 0.4 |

TABLE 2-continued

| | Q1, Q2 abundance ratios upon mixing solution A and solution B [%] | | Film hardness [GPa] | | Oxygen permeability [ml/m² · day · Pa] | | Water vapor permeability [g/m² · day] | |
|---|---|---|---|---|---|---|---|---|
| | Q1 | Q2 | Before storage | After storage | Before storage | After storage | Before storage | After storage |
| Example 3 | 7.8 | 53.9 | 1.5 | 1.5 | 0.5 | 0.5 | 0.5 | 0.5 |
| Example 4 | 23.6 | 49.5 | 1.8 | 1.8 | 0.5 | 0.5 | 0.5 | 0.5 |
| Example 5 | 23.6 | 49.5 | 1.6 | 1.6 | 0.6 | 0.6 | 0.4 | 0.4 |
| Comp. Ex. 1 | 23.6 | 49.5 | 0.8 | 0.3 | 0.7 | 1.5 | 0.9 | 1.4 |
| Comp. Ex. 2 | 23.6 | 49.5 | 1.1 | 0.6 | 0.6 | 0.9 | 0.8 | 1.4 |
| Comp. Ex. 3 | 23.6 | 49.5 | 1.5 | 0.9 | 0.8 | 1.4 | 0.9 | 1.7 |
| Comp. Ex. 4 | 1.8 | 57.1 | 1.3 | 0.6 | 0.8 | 1.7 | 0.9 | 1.5 |
| Comp. Ex. 5 | 23.6 | 49.5 | 0.7 | 0.2 | 1.5 | 2.5 | 0.5 | 1.8 |
| Comp. Ex. 6 | 2.3 | 40.6 | 1.0 | 0.5 | 0.3 | 1.5 | 0.5 | 2.1 |
| Comp. Ex. 7 | 0.0 | 33.5 | 1.2 | 0.9 | 0.9 | 1.1 | 0.9 | 1.2 |

As shown in Table 2, with the gas barrier films of the examples, in which the pH, the mixed solution liquid temperature, the abundance ratio of Q1 and Q2 structures were values in the ranges prescribed for the invention, by controlling the acid catalyst pH and the mixed solution temperature used during preparation of the coating solution for formation of the gas barrier coating film, the gas barrier property was reliably improved, it was possible to form a dense structure for the gas barrier coating film quality, based on the film hardness, and to form an excellent gas barrier coating film with little deterioration seen even after retort treatment.

On the other hand, in the comparative examples in which the values were outside of the ranges prescribed for the invention, the gas barrier property was low, and no improvement was seen in the gas barrier coating film quality, judging from changes in the numerical values for the film hardness.

Depending on the temperature for formation of the coating layer and removal of the solvent, the subsequent heat treatment of the coating film and the treatment temperature, the gas barrier coating film quality was hard, with relatively little deterioration in the gas barrier property due to retort treatment, and therefore an excellent gas barrier property was exhibited. When the coating film was not subjected to heat treatment, the gas barrier property tended to deteriorate and the film hardness was reduced, resulting in an inferior gas barrier coating film.

According to the invention, particularly when comparing the water vapor permeability in a state of high humidity, it was confirmed that there was no notable increase in the water vapor permeability, and excellent gas barrier properties could be maintained even under high temperature and high humidity.

For the comparative examples, on the other hand, a notable increase in water vapor permeability was observed and there was no improvement in the gas barrier property under high temperature and high humidity.

Thus, the gas barrier film of the invention has excellent gas barrier properties for oxygen gas, water vapor and the like and can maintain the excellent gas barrier properties even under high temperature and high humidity, and can exhibit stable gas barrier properties even with prolonged storage without deterioration in the gas barrier property under high temperature and high humidity, which has not been achievable with gas barrier films comprising vapor deposition layers and/or gas barrier coating films of the prior art.

According to the invention, an excellent gas barrier coating film can be formed by controlling the abundance ratio of the Q1 structure and Q2 structure of the alkoxysilane hydrolytic condensate, and the coating film layer can be continuously formed by application or the like, thereby allowing improved productivity to be achieved.

Examples of the invention as modes provided with a vapor deposition layer will now be described.

Example 6

The method for producing the gas barrier films used in the examples and comparative examples of the invention was as follows.

Using 12 μm-thick polyethylene terephthalate (P60 by Toray Co., Ltd.) (Tg: 90 to 100° C.) as the base material, an anchor coating agent prepared under the conditions described below was coated on the corona treated surface to a coating coverage of 0.3 g/m² using a gravure coater.

(Anchor Coating Agent)

As the main agent there was used a solution of a hydroxyl-containing acrylic resin having a number-average molecular weight of 25,000, a glass transition temperature of 85° C. and a hydroxyl value of 80 mgKOH/g, and 3-glycidoxypropyltriethoxysilane, diluted using a mixed solvent of methyl ethyl ketone/ethyl acetate (mixing ratio=1:1) so that the acrylic resin solid concentration of the solution was 10% and the silane coupling agent concentration was 1.5 wt %, and as a curing agent there was used an ethyl acetate solution containing xylene diisocyanate with a solid content of 75%. The curing agent was added at 8 parts by weight with respect to 100 parts by weight of the main agent, to prepare an anchor coating agent for vapor deposition.

Next, the anchor coating agent-coated side was subjected to a physical growth gas phase method by an electron beam heating system, to form an aluminum oxide vapor deposition layer with a film thickness of 10 nm. Next, barrier coating agents prepared under the conditions for each of the examples and comparative examples were applied with a gravure coater, and first heat treatment (drying treatment) was conducted at 110° C. for 30 seconds, and followed by second heat treatment at 85° C. for 72 hours, to form a gas barrier coating layer with a film thickness of 0.3 μm.
(Barrier Coating Agent)

After mixing 677 g of water, 117 g of isopropyl alcohol and 16 g of 0.5N hydrochloric acid, the solution was adjusted to pH 2.2 and 285 g of tetraethoxysilane was mixed therewith while cooling to a liquid temperature of 10° C., to prepare solution A. The bonded states of the silicon atoms in the solution were measured by DD/MAS using a CMX-300 by Chemagnetics, with a measuring nuclear frequency of 59.639191 MHz ($^{29}$C nucleus), giving the results: Q1 structure: 23.6%, Q2 structure: 49.5%.

A mixture of 70 g of polyvinyl alcohol with a saponification degree of ≥99% and a molecular weight of 2400 (Tg: 80° C.), 1540 g of water and 80 g of isopropyl alcohol was prepared as solution B.

As solution A was obtained, it was mixed with solution B at pH 2.2 while cooling to a liquid temperature of 10° C., to a solution A:solution B weight ratio of 6.5:3.5, and the obtained solution was used as the barrier coating agent.

Example 7

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After mixing 677 g of water, 117 g of isopropyl alcohol and 16 g of 0.5N hydrochloric acid, the solution was adjusted to pH 2.7 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 12.1%, Q2 structure: 55.6%.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 2.7 while cooling to a liquid temperature of 10° C., to a weight ratio of 6.5:3.5, and the obtained solution was used as the barrier coating agent.

Example 8

After formation by the same method as Example 6 up to layered formation of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.

The Si bonded states in the solution were measured by DD/MAS using a CMX-300 by Chemagnetics, with a measuring nuclear frequency of 59.639191 MHz ($^{29}$C nucleus), giving the results: Q1 structure: 7.8%, Q2 structure: 53.9%.
(Barrier Coating Agent)

After mixing 677 g of water, 117 g of isopropyl alcohol and 16 g of 0.5N hydrochloric acid, the solution was adjusted to pH 2.4 and 285 g of tetraethoxysilane was mixed therewith while cooling to a liquid temperature of 25° C., to prepare solution A.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 3.0 while cooling to a liquid temperature of 20° C., to a weight ratio of 6.5:3.5, and the obtained solution was used as the barrier coating agent.

Example 9

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After mixing 677 g of water, 117 g of isopropyl alcohol and 16 g of 0.5N hydrochloric acid, the solution was adjusted to pH 2.2 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 23.6%, Q2 structure: 49.5%.

Solution B was prepared by mixing 70 g of ethylene-vinyl copolymer (SOARNOL DC3212 by Nippon Synthetic Chemical Industry Co., Ltd.) (Tg: 60° C.), 1540 g of water and 80 g of isopropyl alcohol.

As solution A was obtained, it was mixed with solution B at pH 2.2 while cooling to a liquid temperature of 10° C., to a solution A:solution B weight ratio of 6.5:3.5, and the obtained solution was used as the barrier coating agent.

Comparative Example 8

This was conducted by the same method as Example 6, except that the second heat treatment after application of the barrier coating agent was not carried out, to form a coating layer with a gas barrier property, having a film thickness of 0.3 μm.

Comparative Example 9

This was conducted by the same method as Example 6, except that the second heat treatment conditions after application of the barrier coating agent were 55° C., 72 hours, to form a coating layer with a gas barrier property, having a film thickness of 0.3 μm.

Comparative Example 10

This was conducted by the same method as Example 6, except that the first heat treatment conditions after application of the barrier coating agent were 90° C., 30 seconds, to form a coating layer with a gas barrier property, having a film thickness of 0.3 μm.

Comparative Example 11

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After mixing 677 g of water, 117 g of isopropyl alcohol and 16 g of 0.5N hydrochloric acid, the solution was adjusted to pH 3.0 and 285 g of tetraethoxysilane was mixed therewith while cooling to a liquid temperature of 10° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 1.8%, Q2 structure: 57.1%.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 3.0 while cooling to a liquid temperature of 10° C., to a solution A:solution B weight ratio of 6.5:3.5, and the obtained solution was used as the barrier coating agent.

Comparative Example 12

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After mixing 677 g of water, 117 g of isopropyl alcohol and 16 g of 0.5N hydrochloric acid, the solution was adjusted to pH 2.2 and 285 g of tetraethoxysilane was mixed therewith while cooling to a liquid temperature of 35° C., to prepare solution A. The Si bonded states in the solution were measured by DD/MAS using a CMX-300 by Chemagnetics, with a measuring nuclear frequency of 59.639191 MHz ($^{29}$C nucleus), giving the results: Q1 structure: 0%, Q2 structure: 42.8%.

A mixture of 70 g of polyvinyl alcohol with a saponification degree of ≥99% and a molecular weight of 2400, 1540 g of water and 80 g of isopropyl alcohol was prepared as solution B.

As solution A was obtained, it was mixed with solution B at pH 2.2 while cooling to a liquid temperature of 35° C., to a solution A:solution B weight ratio of 6.5:3.5, and the obtained solution was used as the barrier coating agent.

Comparative Example 13

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After mixing 179.2 g of 0.1N hydrochloric acid with 208 g of tetraethoxysilane, the mixture was stirred for 30 minutes to prepare hydrolyzed solution A with a solid content of 3 wt % (as $SiO_2$). The Si bonded states in the solution were measured by DD/MAS using a CMX-300 by Chemagnetics, with a measuring nuclear frequency of 59.639191 MHz ($^{29}$C nucleus), giving the results: Q1 structure: 2.3%, Q2 structure: 40.6%.

A mixture of 67 g of polyvinyl alcohol with a saponification degree of ≥99% and a molecular weight of 2400, 1540 g of water and 80 g of isopropyl alcohol was prepared as solution B.

As solution A was obtained, it was mixed with solution B to a solution A:solution B weight ratio of 6.0:4.0, and the obtained solution was used as the barrier coating agent.

Comparative Example 14

After formation by the same method as Example 6 up to layering of the anchor coat and the aluminum oxide vapor deposition, the barrier coating agent prepared under the following conditions was coated onto the aluminum oxide vapor deposition film with a gravure coater, after which it was heat treated under the same conditions as Example 6 to form a coating layer with a gas barrier property, to a film thickness of 0.3 μm.
(Barrier Coating Agent)

After adding 72.1 g of 0.1N hydrochloric acid to 17.9 g of tetraethoxysilane and 10 g of methanol, the mixture was stirred for 30 minutes to prepare hydrolyzed solution A with a solid content of 5 wt % (as $SiO_2$).

The Si bonded states in the solution were measured by DD/MAS using a CMX-300 by Chemagnetics, with a measuring nuclear frequency of 59.639191 MHz ($^{29}$C nucleus), giving the results: Q1 structure: 0%, Q2 structure: 33.5%.

A mixture of 105.3 g of polyvinyl alcohol with a saponification degree of ≥99% and a molecular weight of 2400, 1900 g of water and 100 g of isopropyl alcohol was prepared as solution B.

Also, 1N hydrochloric acid was gradually added to a solution of γ-glycidoxypropyltrimethoxysilane and IPA, the mixture was stirred for 30 minutes, and after hydrolysis, hydrolysis was carried out with a solution of water/IPA=1/1, to prepare solution C having a solid content of 5 wt % (as $R^2Si(OH)_3$ weight ratio).

Solutions A, B and C were mixed at a weight ratio of 7.0:2.0:1.0, to obtain a solution as a barrier coating agent.
(Measurement and Evaluation of Gas Barrier Film of the Invention)

Table 3 shows the results of measurement for the coating film structure of the gas barrier coating films of the gas barrier films of the examples and comparative examples.

The nanocomposite films with coating film structures formed according to the invention were able to obtain a higher proportion of network structure formation than the gas barrier coating films of the comparative examples. Furthermore, as regards the effect on the abundance ratio of Q1 and Q2 structures in the barrier coating agents used to form the gas barrier coating films, by comparative analysis of the area intensity ratio of peaks obtained by laser Raman spectroscopic analysis of the Si bonded states shown in Table 3, with an abundance ratio of 60% for Q1 and Q2 structures as the boundary, it was shown that a greater network structure was clearly formed by those with a high abundance ratio of (Q1+Q2) structures than those with a low abundance ratio.

Furthermore, as regards the state of the water-soluble polymer in the gas barrier coating film structure, the 70 ppm peak area ratio was considerably larger in the examples than in the comparative examples, and more hydroxy groups participated in intramolecular hydrogen bonding in the water-soluble polymer, while the hydrogen nuclear relaxation time $T_1\rho$ reflecting the motion mode corresponding to the polymer main chain was longer in the examples than in the comparative examples, such that the molecular mobility was judged to be lower.

Based on these results, the gas barrier coating film formed by the improved sol-gel method of the invention has a high proportion of network structure formed, with advanced crystallization of the water-soluble polymer, which is assumed to be in a microcrystalline state, while the water-soluble polymer also has low molecular mobility, and is assumed to be incorporated and crystallized in the mesh of the network structure. Thus, the gas barrier coating film of the invention can be evaluated as forming a nanocomposite film comprising dispersed polymer microcrystals and a network structure of siloxane bonds stably holding them.

Furthermore, when the temperature for the second heat treatment and the heat treatment temperature for drying treatment are temperature conditions outside of the conditions of Example 6 of the invention, as in Comparative Examples 8 to 10, the proportion of network structure formed was lower compared to Example 6, and the proportion of microcrystallized water-soluble polymer did not increase and high molecular mobility remained, whereby it could be evaluated that a low proportion of water-soluble polymer was incorporated into the network structure.

TABLE 3

| | Q1, Q2 abundance ratios upon mixing solution A and solution B [%] | | $A_{425}/A_{490}$ [Area intensity ratio] | 70 ppm peak area ratio [%] | Hydrogen nuclear relaxation time $HT_{1\rho}$ [msec] |
|---|---|---|---|---|---|
| | Q1 | Q2 | | | |
| Example 6 | 23.6 | 49.5 | 2.53 | 48.7 | 2.3 |
| Example 7 | 12.1 | 55.6 | 2.68 | 46.1 | 2.0 |
| Example 8 | 7.8 | 53.9 | 2.75 | 45.0 | 2.0 |
| Example 9 | 23.6 | 49.5 | 2.51 | 43.6 | 2.2 |
| Comp. Ex. 8 | 23.6 | 49.5 | 1.13 | 9.6 | 0.2 |
| Comp. Ex. 9 | 23.6 | 49.5 | 1.66 | 25.4 | 0.7 |
| Comp. Ex. 10 | 23.6 | 49.5 | 1.79 | 24.3 | 1.2 |
| Comp. Ex. 11 | 1.8 | 57.1 | 1.53 | 23.5 | 0.9 |
| Comp. Ex. 12 | 0.0 | 42.8 | 1.30 | 18.8 | 0.6 |
| Comp. Ex. 13 | 2.3 | 40.6 | 1.44 | 19.5 | 0.7 |
| Comp. Ex. 14 | 0.0 | 33.5 | 1.29 | 16.7 | 1.8 |

Table 4 shows the results of analysis of the physical properties of gas barrier coating films of the invention.

The gas barrier coating films formed in the examples of the invention had high gas barrier properties for both oxygen and water vapor, and low deterioration of the gas barrier properties even after retort treatment. Moreover, it was clearly shown that the formed gas barrier coating films had low reduction in film hardness before and after retort sterilization, and the nanocomposite films of the invention had been formed as coating films that were dense and hard with an excellent gas barrier property.

The physical properties of the gas barrier coating films of the invention were compared by changing influential factors in contrast with the examples, including not only the composition but also the pH, the liquid temperature during reaction of the mixed solution, and the heating temperature for volatilization of the solvent, to allow evaluation of the abundance ratio, film hardness and oxygen or water vapor permeability.

TABLE 4

| | Q1, Q2 abundance ratios upon mixing solution A and solution B [%] | | Film hardness [GPa] | | Oxygen permeability [ml/m$^2$ · day · Pa] | | Water vapor permeability [g/m$^2$ · day] | |
|---|---|---|---|---|---|---|---|---|
| | Q1 | Q2 | Before retort treatment | After retort treatment | Before retort treatment | After retort treatment | Before retort treatment | After retort treatment |
| Example 6 | 23.6 | 49.5 | 1.8 | 1.6 | 0.1 | 0.2 | 0.1 | 0.3 |
| Example 7 | 12.1 | 55.6 | 1.7 | 1.3 | 0.1 | 0.2 | 0.1 | 0.4 |
| Example 8 | 7.8 | 53.9 | 1.5 | 1.2 | 0.2 | 0.3 | 0.2 | 0.4 |
| Example 9 | 23.6 | 49.5 | 1.8 | 1.7 | 0.2 | 0.2 | 0.2 | 0.4 |
| Comp. Ex. 8 | 23.6 | 49.5 | 0.8 | 0.2 | 0.6 | 1.9 | 0.9 | 3.4 |
| Comp. Ex. 9 | 23.6 | 49.5 | 1.1 | 0.4 | 0.2 | 0.9 | 0.3 | 2.3 |
| Comp. Ex. 10 | 23.6 | 49.5 | 1.5 | 0.6 | 0.2 | 0.8 | 0.2 | 2.0 |
| Comp. Ex. 11 | 1.8 | 57.1 | 1.3 | 0.6 | 0.2 | 0.7 | 0.4 | 1.5 |
| Comp. Ex. 12 | 0.0 | 42.8 | 1.1 | 0.5 | 0.3 | 1.7 | 0.5 | 2.5 |
| Comp. Ex. 13 | 2.3 | 40.6 | 1.0 | 0.5 | 0.3 | 1.5 | 0.5 | 2.1 |
| Comp. Ex. 14 | 0.0 | 33.5 | 1.2 | 0.9 | 0.5 | 0.9 | 0.6 | 1.8 |

As shown in Table 4, with the gas barrier films of the examples, in which the pH, the mixed solution liquid temperature, the abundance ratio of Q1 and Q2 structures were values in the ranges prescribed for the invention, by controlling the acid catalyst pH and the mixed solution temperature used during preparation of the coating solution for formation of the gas barrier coating film, the gas barrier property was reliably improved, it was possible to form a dense structure for the gas barrier coating film quality, based on the film hardness, and to form an excellent gas barrier coating film with little deterioration seen even after retort treatment.

On the other hand, in the comparative examples in which the values were outside of the ranges prescribed for the invention, the gas barrier property was low, and no improvement was seen in the gas barrier coating film quality, judging from changes in the numerical values for the film hardness.

Depending on the temperature for formation of the coating layer and removal of the solvent, the subsequent heat treatment of the coating film and the treatment temperature, the gas barrier coating film quality was hard, with relatively little deterioration in the gas barrier property due to retort treatment, and therefore an excellent gas barrier property was exhibited. When the coating film was not subjected to heat treatment, the gas barrier property tended to deteriorate and the film hardness was reduced, resulting in an inferior gas barrier coating film.

According to the invention, particularly when comparing the water vapor permeability in a state of high humidity, it was confirmed that with the examples of the invention, there was no notable increase in the water vapor permeability, and excellent gas barrier properties could be maintained even under high temperature and high humidity.

For the comparative examples, on the other hand, a notable increase in water vapor permeability was observed and there was no improvement in the gas barrier property under high temperature and high humidity.

As explained above, with the gas barrier film of the invention, the gas barrier coating film functions as a protective thin-film that protects the metal oxide vapor deposition layer, preventing reduction in the barrier property by damage to the metal oxide vapor deposition layer, while it is possible exhibit an excellent gas barrier property for oxygen gas, water vapor and the like and to maintain the excellent gas barrier property even under high-temperature hot water treatment in boiling or retort sterilization treatment, so that it is possible to obtain a stable gas barrier property with minimal deterioration in the gas barrier property after high-temperature hot water treatment, which has not been achievable with conventional gas barrier films comprising a vapor deposition layer and gas barrier coating film.

According to the invention, an excellent gas barrier coating film can be formed by controlling the abundance ratio of the Q1 structure and Q2 structure of the alkoxysilane hydrolytic condensate, and each coating film layer can be continuously formed by vapor deposition, application and the like, thereby allowing improved productivity to be achieved.

According to the invention, the gas barrier coating film has an excellent gas barrier property and flexibility, and is therefore useful as a packaging material, and especially as a food packaging film or medical packaging film.

The gas barrier film of the invention also has excellent gas barrier properties after hot water treatment, and especially after high-temperature hot water treatment and retort sterilization treatment.

The invention claimed is:

1. A gas barrier film having a base material made of a polymer resin composition, on which is layered a nanocomposite film comprising dispersed polymer microcrystals and a network structure of siloxane bonds stably holding them, wherein the nanocomposite film is formed from a polymer resin and a partial hydrolytic condensate of an alkoxysilane, wherein the proportion of Q1 and Q2 structures of the bonded states of the silicon atoms of the alkoxysilane hydrolytic condensate is at least 60% of the total silicon atoms.

2. A gas barrier film according to claim 1, wherein the dispersed polymer microcrystals are of a water-soluble polymer.

3. A gas barrier film according to claim 1, wherein the partial hydrolytic condensate is obtained by hydrolysis of an alkoxysilane with the general formula $Si(OR)_4$ (where R is an alkyl group) under conditions with a pH 1.5 to 3.0 and a liquid temperature of between 5° C. and 30° C.

4. A gas barrier film according to claim 1 wherein, when the bonded states of the silicon atoms in the nanocomposite film have been analyzed by laser Raman spectroscopy, the ratio $A_{425}/A_{490}$ of the area intensity ($A_{425}$) at 425 cm$^{-1}$ (peak due to the network structure) and the area intensity ($A_{490}$) at 490 cm$^{-1}$ (peak not contributing to the network structure) is between 2.0 and 3.0, inclusive.

5. A gas barrier film according to claim 1 wherein, when the state of the water-soluble polymer in the nanocomposite film has been analyzed by CP/MAS using a solid $^{13}$C-NMR device, waveform separation of the peak for 70 ppm from the spectrum obtained at 66 to 75 ppm is performed and the peak area ratio ($A_{70\ ppm}/A_{66\text{-}75\ ppm}$)× 100 is 40% or greater.

6. A gas barrier film according to claim 1, wherein the hydrogen relaxation time obtained using a solid $^{13}$C-NMR device, based on the molecular mobility of the water-soluble polymer in the nanocomposite film, is 2.0 msec or longer.

7. A gas barrier film according to claim 1, wherein the nanocomposite film has a hardness of 1.0 GPa or greater as measured by a nanoindentation method after 500 hours of storage under conditions of 60° C., 90% RH.

8. A method for producing a gas barrier film according to claim 1, in which a partial hydrolytic condensate of an alkoxysilane with the general formula $Si(OR)_4$ (where R is an alkyl group) is copresent with a water-soluble polymer, is coated onto a base material comprising a polymer resin composition, and then heat treatment is carried out at least twice to form a nanocomposite film comprising polymer microcrystals and a siloxane bond network holding them.

9. A method for producing a gas barrier film according to claim 8, wherein the first heat treatment is treatment that removes the solvent and forms a coating film, and the temperature conditions for the second heat treatment are lower temperature than the temperature conditions for the first heat treatment.

10. A method for producing a gas barrier film according to claim 8, wherein the temperature (T) for the first heat treatment is in the range of $(T_{bp})° C.-(T_{bp}) +100° C.$, where $T_{bp}$ is the boiling point of the solvent used in the solution in which the partial hydrolytic condensate of an alkoxysilane represented by the general formula $Si(OR)_4$ (where R is an alkyl group), and the water-soluble polymer are copresent, and the temperature for the second heat treatment is in the range of $(T_{g\text{-}coat})° C.-(T_{g\text{-}base})° C.$, where $T_{g\text{-}coat}$ is the glass transition temperature of the water-soluble polymer and $T_{g\text{-}base}$ is the glass transition temperature of the base material film.

11. A method for producing a gas barrier film according to claim 8, wherein the heating time for the second heat treatment is longer than the heating time for the first heat treatment, the heating time for the second heat treatment being 1 to 300 hours.

12. A method for producing a gas barrier film according to claim 8, wherein the heating time for the second heat treatment is 50 to 200 hours.

13. A packaging material having a heat-sealable resin layered on the surface of a nanocomposite film according to claim 1, via an adhesive layer.

14. A packaging material according to claim 13, wherein the packaging material is to be used in a retort sterilization packaging.

15. A packaging material having a heat-sealable resin layered on the surface of a nanocomposite film according to claim 1 via an adhesive layer, after having formed a printed layer.

16. A gas barrier film having a base material made of a polymer resin composition with a vapor deposition layer made of aluminum oxide provided over it, and further layered on the vapor deposition layer, a nanocomposite film comprising dispersed polymer microcrystals and a network structure of siloxane bonds stably holding them, wherein the nanocomposite film is formed from a polymer resin and a partial hydrolytic condensate of an alkoxysilane, wherein the proportion of Q1 and Q2 structures of the bonded states of the silicon atoms of the alkoxysilane hydrolytic condensate is at least 60% of the total silicon atoms.

17. A gas barrier film according to claim 16, wherein the nanocomposite film has a hardness of 1.0 GPa or greater as measured by a nanoindentation method after retort sterilization treatment at 135° C. for 30 minutes.

18. A gas barrier film according to claim 16, wherein the vapor deposition layer is formed by holding the surface of the plastic base material in a voltage-applied state between a plasma pretreatment roller and plasma supply means for plasma pretreatment, and then continuously forming an inorganic oxide vapor deposition film composed mainly of aluminum oxide.

19. A gas barrier film according to claim 18, wherein the plasma pretreatment is plasma pretreatment using a roller-type continuous vapor deposition film-forming apparatus comprising, in a continuous manner, a pretreatment chamber in which the surface of a plastic base material to be provided with a vapor deposition film is subjected to plasma treatment, and a film-forming chamber in which the vapor deposition film is formed, the plasma pretreatment being designed such that there are situated a pretreatment roller and plasma supply means and magnetic field-forming means facing the pretreatment roller, the supplied plasma source gas is introduced as plasma near the base material surface, with a gap being formed that traps the plasma, and the plasma treatment is carried out while holding in a voltage-applied state between the plasma pretreatment roller and the plasma supply means.

20. An adhesiveness-reinforced and moist heat-resistant gas barrier film according to claim 18, wherein the pretreatment by plasma is treatment in which the surface of the plastic base material on which the vapor deposition film is to be provided is treatment using a roller-type continuous vapor deposition film-forming apparatus having a separated plasma pretreatment chamber and vapor deposition film-forming chamber, under conditions with a plasma strength per unit area of 100-8000 W sec/m$^2$.

21. A gas barrier film according to claim 16, having Al—C covalent bonds at the interface between the plastic base material and the inorganic oxide vapor deposition film composed mainly of aluminum oxide.

22. A method for producing a gas barrier film according to claim 16, wherein a vapor deposition layer comprising aluminum oxide is formed on a base material comprising a polymer resin composition, and a solution in which a partial hydrolytic condensate of an alkoxysilane with the general formula Si(OR)$_4$ (where R is an alkyl group) is copresent with a water-soluble polymer, is coated onto the vapor deposition layer, after which heat treatment is carried out at least twice to form a nanocomposite film comprising polymer microcrystals and a siloxane bond network holding them.

* * * * *